United States Patent
Kub et al.

(10) Patent No.: US 9,685,513 B2
(45) Date of Patent: Jun. 20, 2017

(54) SEMICONDUCTOR STRUCTURE OR DEVICE INTEGRATED WITH DIAMOND

(71) Applicants: Francis J. Kub, Arnold, MD (US); Travis J. Anderson, Alexandria, VA (US); Karl D. Hobart, Upper Marlboro, MD (US)

(72) Inventors: Francis J. Kub, Arnold, MD (US); Travis J. Anderson, Alexandria, VA (US); Karl D. Hobart, Upper Marlboro, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/060,916

(22) Filed: Oct. 23, 2013

(65) Prior Publication Data

US 2014/0110722 A1   Apr. 24, 2014

Related U.S. Application Data

(60) Provisional application No. 61/717,678, filed on Oct. 24, 2012.

(51) Int. Cl.
*H01L 23/532* (2006.01)
*H01L 29/16* (2006.01)
(Continued)

(52) U.S. Cl.
CPC ...... *H01L 29/1602* (2013.01); *H01L 23/3732* (2013.01); *H01L 23/5329* (2013.01);
(Continued)

(58) Field of Classification Search
CPC ............ H01L 23/5329; H01L 29/1602; H01L 29/205; H01L 29/66462
See application file for complete search history.

(56) References Cited

U.S. PATENT DOCUMENTS 5,278,430 A * 1/1994 Kakumu .................... 257/77
7,595,507 B2   9/2009 Francis et al.
(Continued)

OTHER PUBLICATIONS http://www.csmantech.org/Digests/2011/papers/old%20numbering/027.pdf Development of III-Nitride HEMTs on CVD Diamond Substrates F. Faili1, Q. Diduck1, D.I. Babic1, D. Francis1, F. Ejeckam1, J.D. Blevins2 CS MANTECH Conference, May 16-19, 2011, Palm Springs, California, USA.*
(Continued)

*Primary Examiner* — Thanh V Pham
(74) *Attorney, Agent, or Firm* — U.S. Naval Research Laboratory; William Ladd

(57) ABSTRACT

Semiconductor devices that include a semiconductor structure integrated with one or more diamond material layers. A first diamond material layer is formed on a bottom surface and optionally, the side surfaces of the semiconductor structure. In some embodiments, at least a portion of the semiconductor structure is embedded in the diamond. An electrical device can be formed on a top surface of the semiconductor structure. A second diamond material layer can be formed on the top surface of the semiconductor structure. The semiconductor structure can include a III-nitride material such as GaN, which can be embedded within a the first diamond material layer or encased by the first and/or second diamond material layer.

20 Claims, 23 Drawing Sheets

(51) Int. Cl.
*H01L 29/205* (2006.01)
*H01L 29/20* (2006.01)
*H01L 29/78* (2006.01)
*H01L 29/66* (2006.01)
*H01L 29/778* (2006.01)
*H01L 23/373* (2006.01)

(52) U.S. Cl.
CPC ........ *H01L 29/2003* (2013.01); *H01L 29/205* (2013.01); *H01L 29/66462* (2013.01); *H01L 29/7787* (2013.01); *H01L 29/78* (2013.01)

(56) References Cited

U.S. PATENT DOCUMENTS

| | | | |
|---|---|---|---|
| 7,989,925 B2 | 8/2011 | Cheng et al. | |
| 8,039,301 B2 * | 10/2011 | Kub et al. | 438/105 |
| 8,283,189 B2 | 10/2012 | Francis et al. | |
| 8,283,672 B2 | 10/2012 | Francis et al. | |
| 8,445,383 B2 | 5/2013 | Hobart | |
| 8,497,513 B2 * | 7/2013 | Kohn et al. | 257/77 |
| 2006/0174823 A1 * | 8/2006 | Sung | 117/84 |

OTHER PUBLICATIONS http://www.sciencedirect.com/science/article/pii/S0925963598002635 Diamond and Related Materials, vol. 8, Issues 2-5, Mar. 1999, pp. 309-313 Fabrication of aluminium nitride/diamond and gallium nitride/diamond SAW devices P.R Chalkera, , T.B Joycea, C Johnstonb, J.A.A Crossleyb, J Huddlestonec, M.D Whitfieldc, R.B Jackmanc.*

O.A. Williams, "Nanocrystalline Diamond," Diamond & Related Materials vol. 20 (2011) 621-640.

J.E. Butler and A.V. Sumant, "The CVD of Nanodiamond Materials," Chem. Vap. Deposition 2008, 14, 145-160.

M.J. Tadjer, T.J. Anderson, K.D. Hobart, T.I. Feygelson, J.D. Caldwell, C.R. Eddy, Jr., F.J. Kub, J.E. Butler, B. Pate, and J. Melngailis, Reduced Self-Heating in AlGaN/GaN HEMTs Using Nanocrystalline Diamond Heat-Spreading Films, IEEE Electron Device Letters., vol. 33, No. 1, pp. 23-25 (2012).

K.D. Chabak, J.K. Gillespie, V. Miller, A. Crespo, J. Roussos, M. Trejo, D.E. Walker, Jr., G.D. Via, G.H. Jessen, J. Wasserbauer, F. Faili, D.I. Babic, D. Francis, and F. Ejeckam, "Full-wafer characterization of AlGaN/GaN HEMTs of freestanding CVD diamond substrates," IEEE Electron Device Letters, vol. 31, No. 2, pp. 99-101, Feb. 2010.

K. Hirama, M. Kasu, and Y. Taniyasu, "RF High-Power Operation of AlGaN/GaN HEMTs Epitaxially Grown on Diamond," IEEE Electron Device Letters, vol. 33, No. 4, pp. 513, 2012.

M. Seelman-Eggebert, P. Meisen, F. Schaudel, P. Koidl, A. Vescan, and H. Leier, "Heat-spreading diamond films for GaN-based high-power transistor devices," Diamond and Related Materials, vol. 10, No. 3-7, pp. 744-749, 2001.

Z. Yan, G. Liu, J.M. Khan, and A.A. Balandin, "Graphene quilts for thermal management of high-power GaN transistors," Nature Communications 3, 827, 2012.

T.I. Feygelson, T.J. Anderson, M. P. Ray, K.D. Hobart, and B.R. Pate, "Detonation versus laser-synthesized nanodiamond powders for seeding" 22nd European Conference on Diamond, Diamond-Like Materials, Carbon Nanotubes and Nitrides, Garmisch-Partenkirchen, Germany, 2011.

K.D. Hobart et al., International Conference on Diamond and Carbon Materials, Granada, Spain, 2012.

N. Ranganathan, L. Ebin, L. Linn, L. W. S. Vincent, O. K. Navas, V. Kripesh, and N. Balasubramanian, "Integration of High Aspect Ratio Tapered Silicon Via for Silicon Carrier Fabrication," IEEE Trans. on Adv. Packaging, vol. 32, No. 1, pp. 62, 2009.

M. Azize and T. Palacios, "Effect of substrate-induced strain in the transport properties of AlGaN/GaN heterostructures," J. Appl. Phys. 108, 023707 (2010).

T.J. Anderson, K.D. Hobart, M.J. Tadjer, T.I. Feygelson, E.A. Imhoff, D.J. Meyer, D.S. Katzer, J.K. Hite, F.J. Kub, B.B. Pate, S.C. Binari, and C.R. Eddy, Jr., "Improved GaN-based HEMT Performance by Nanocrystalline Diamond Capping," Device Research Conference Digest, pp. 155-156, 2012.

A. Wang, M.J. Tadjer, T.J. Anderson, R. Baranyai, J. Pomeroy, T.I. Feygelson, K.D. Hobart, B.B. Pate, F. Calle, and M. Kuball, "Impact of Intrinsic Stress in Diamond Capping Layers on the Electrical Behavior of AlGaN/GaN HEMTs," IEEE Trans. Electr. Dev., vol. 60, No. 10, pp. 3149-3156, 2013.

* cited by examiner

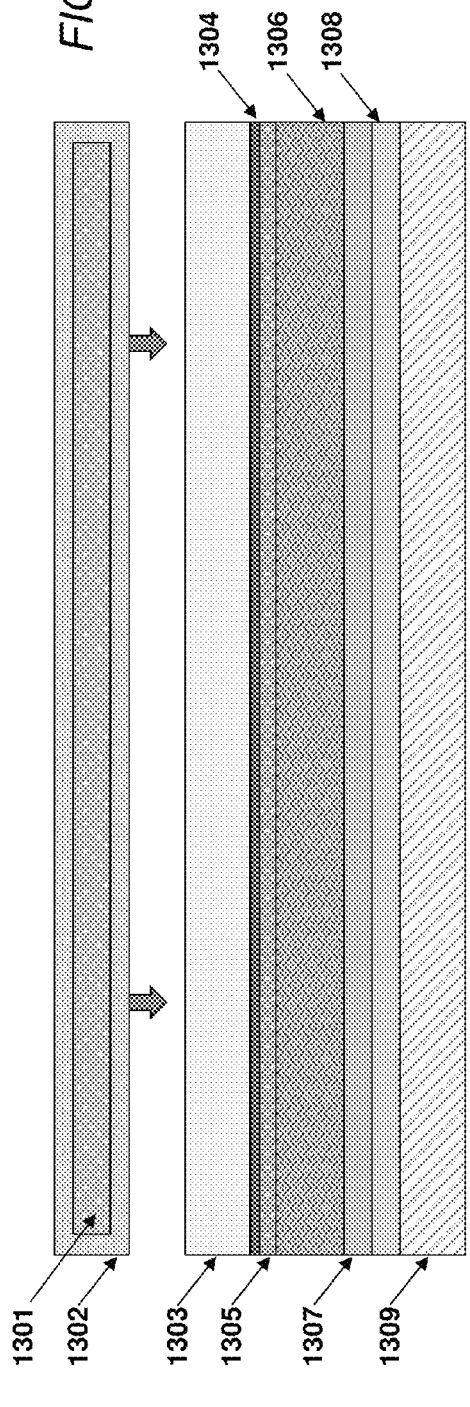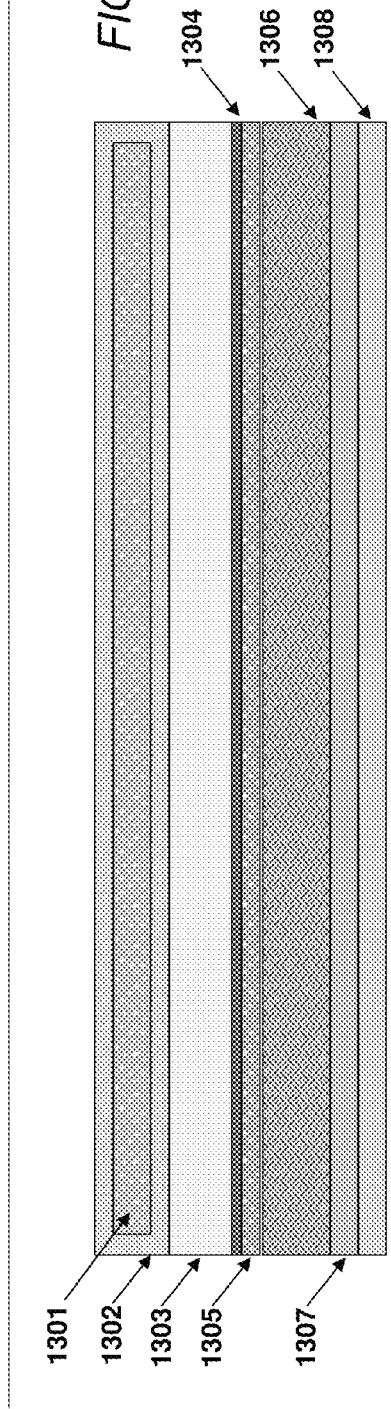

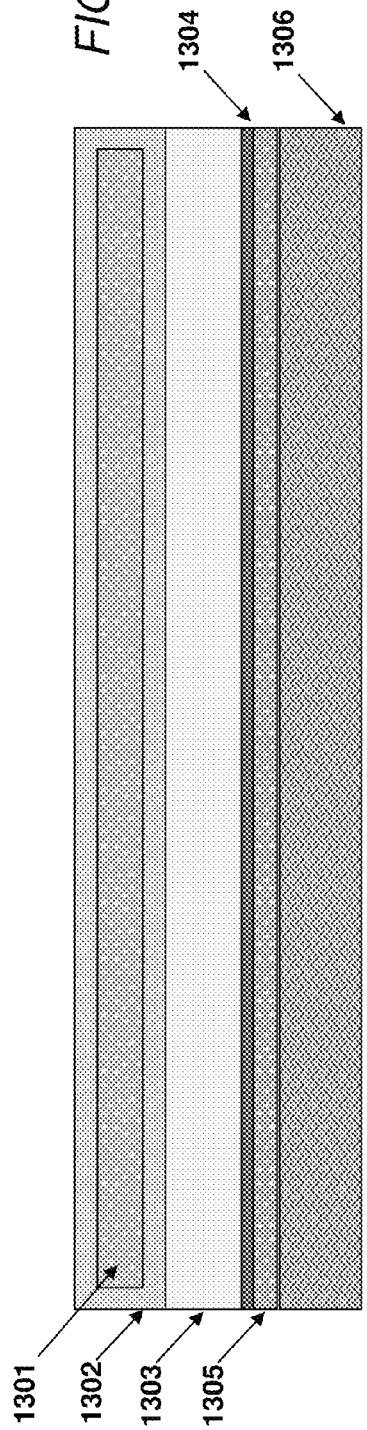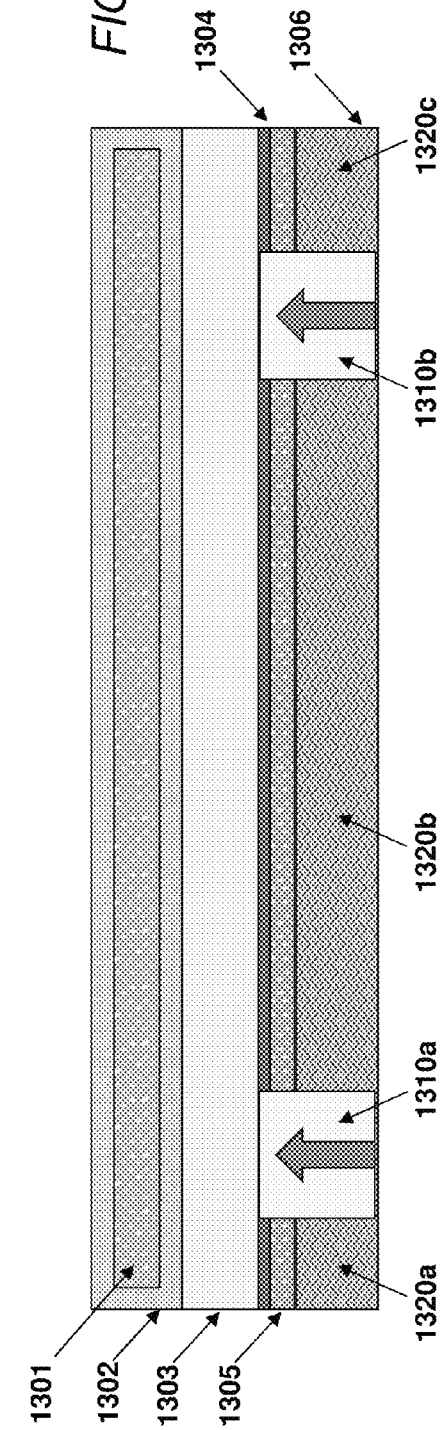

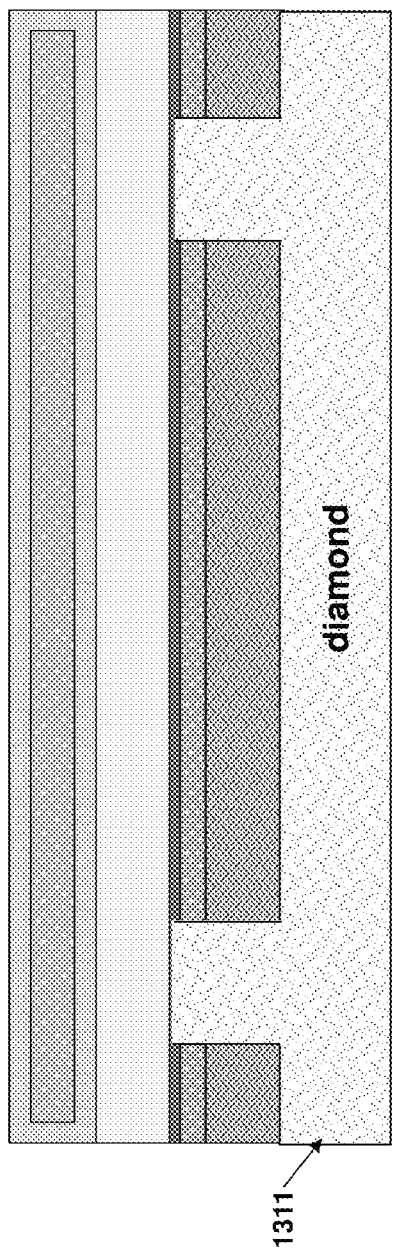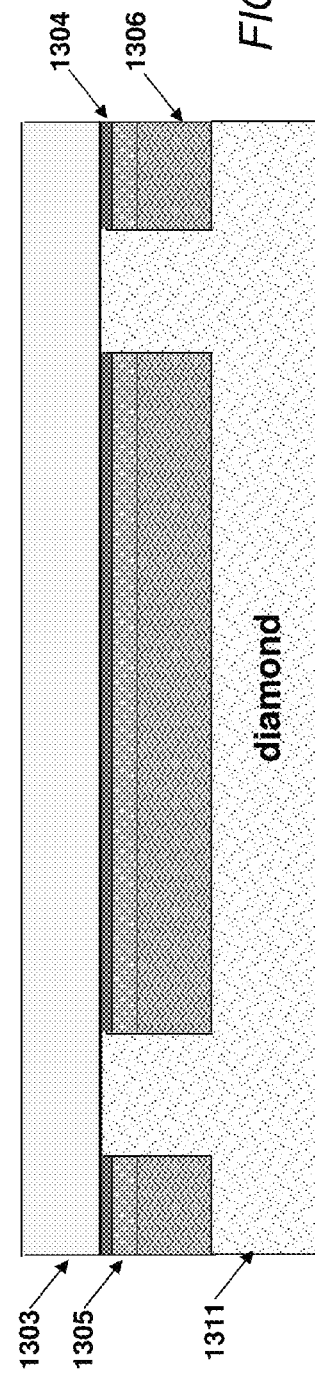

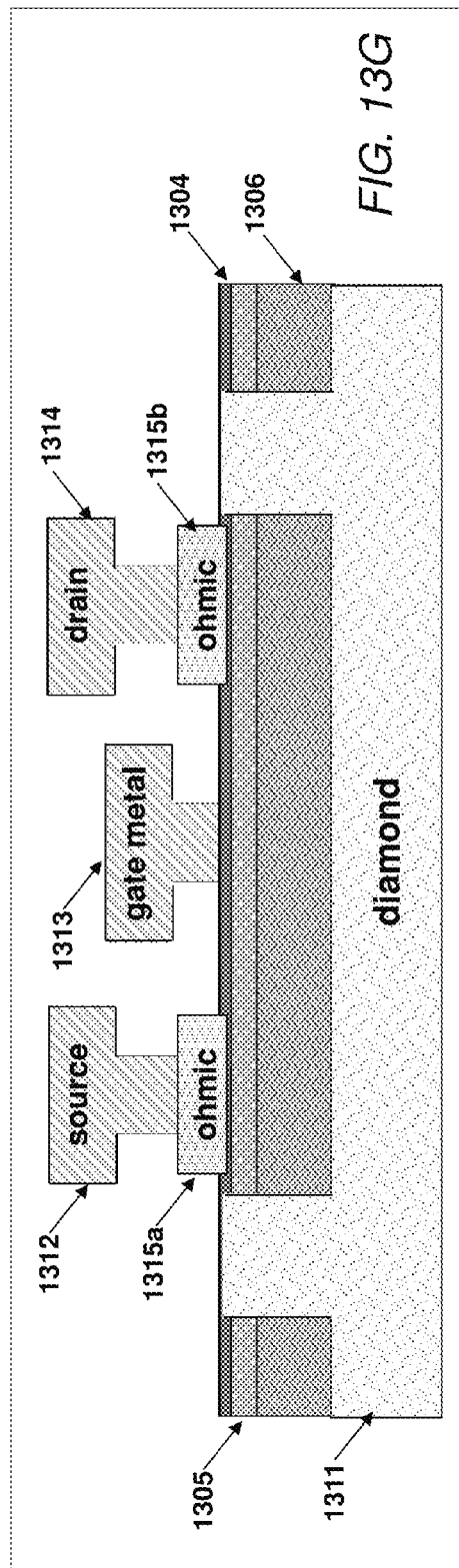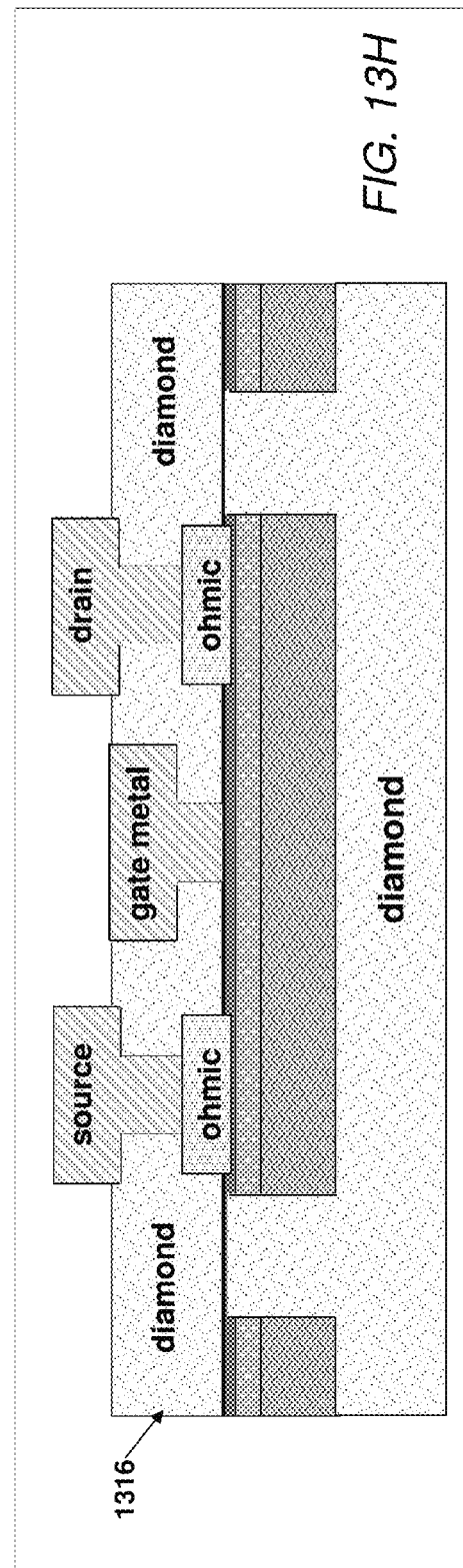

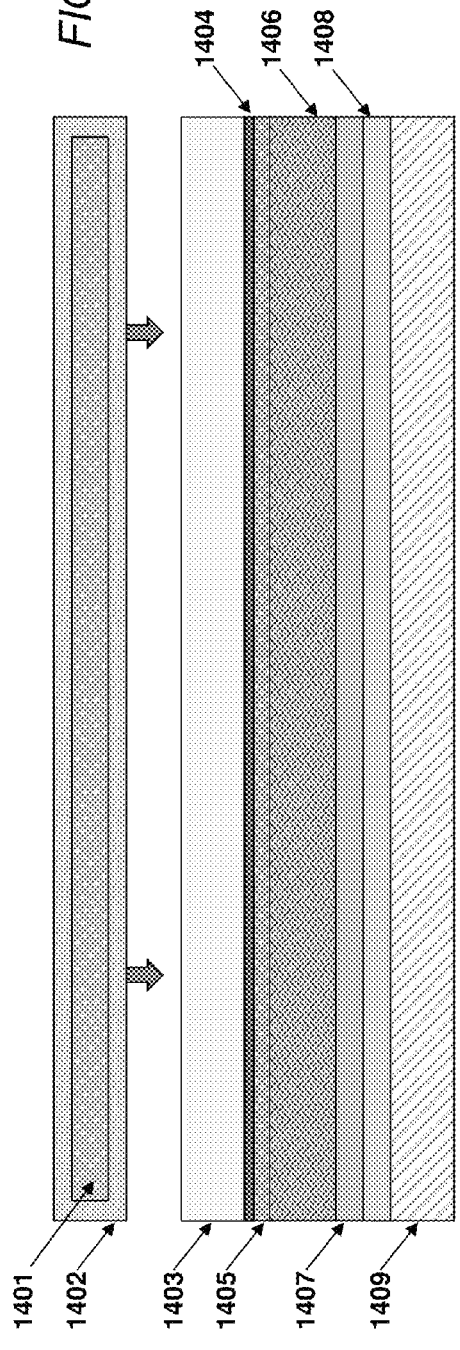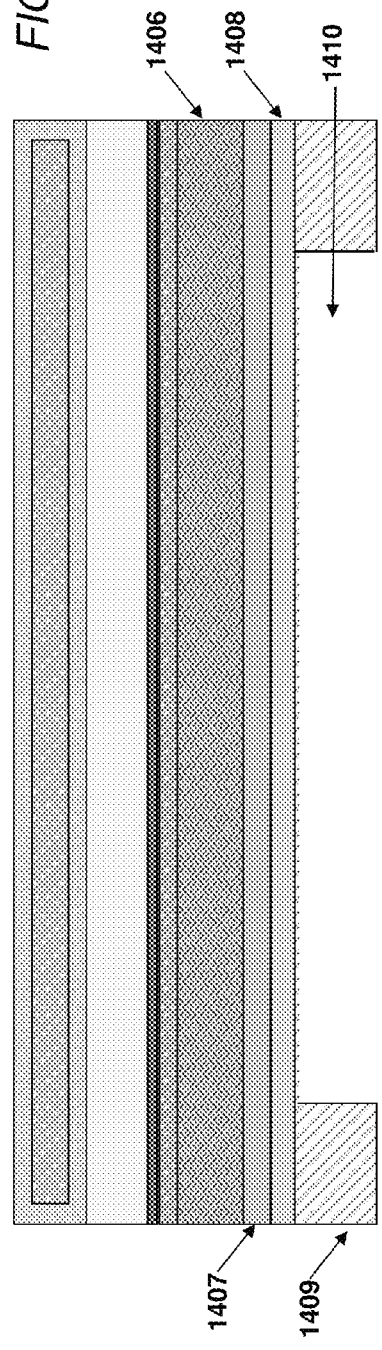

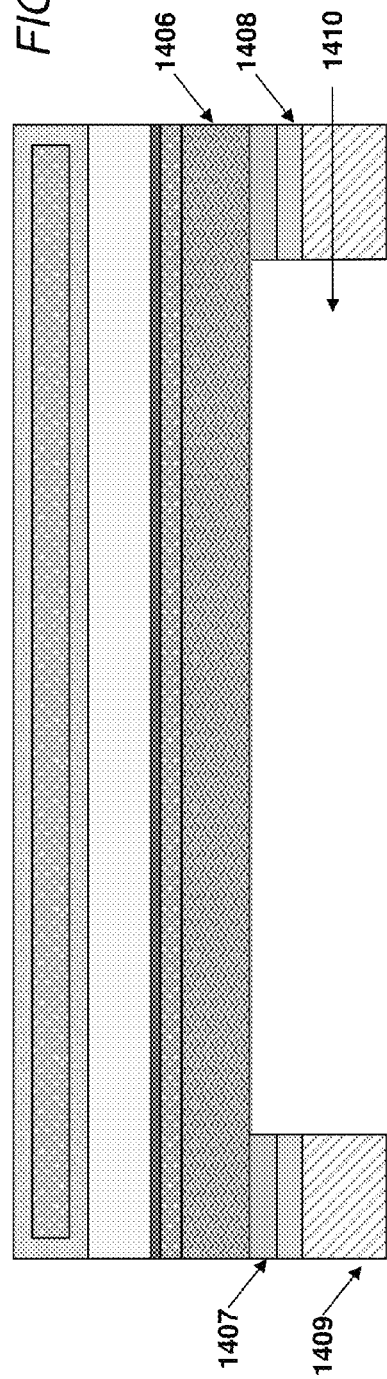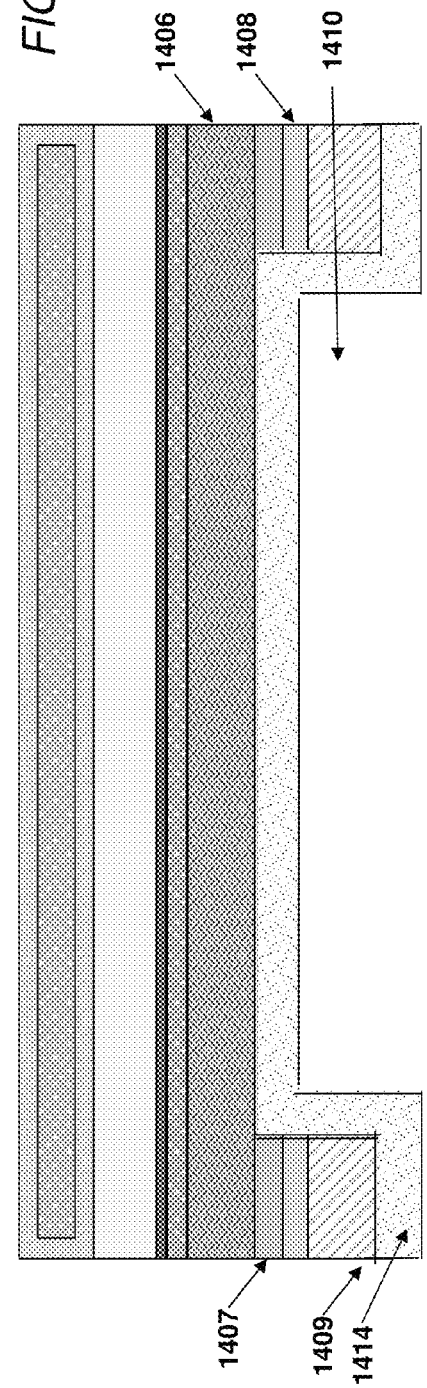

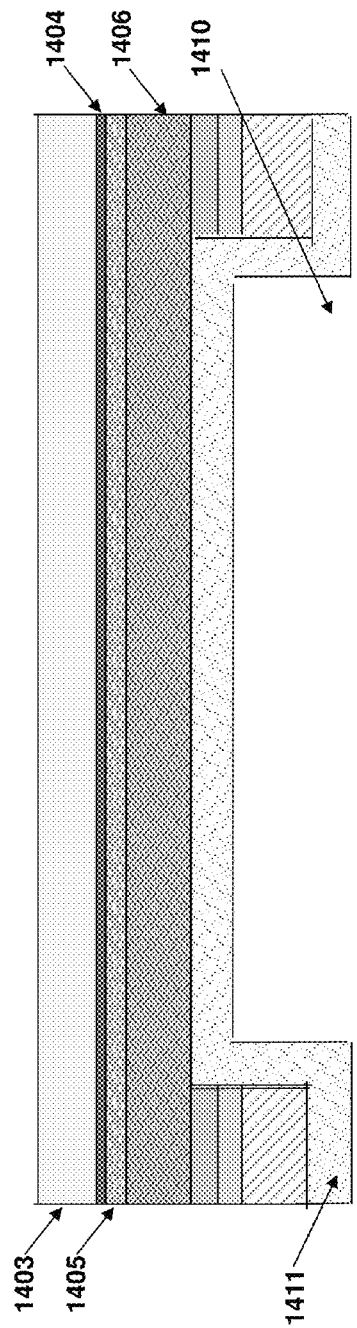
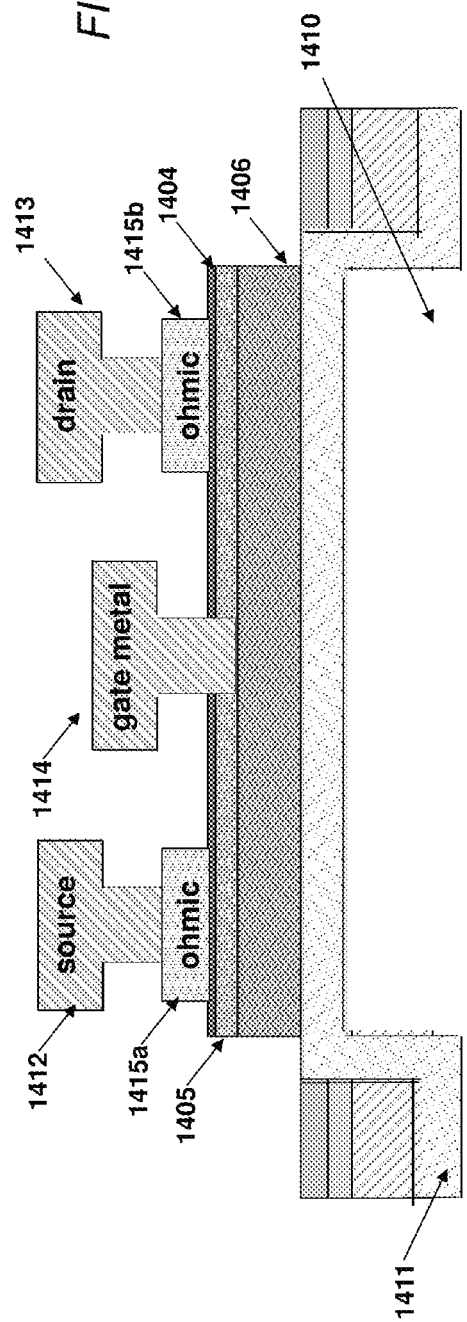

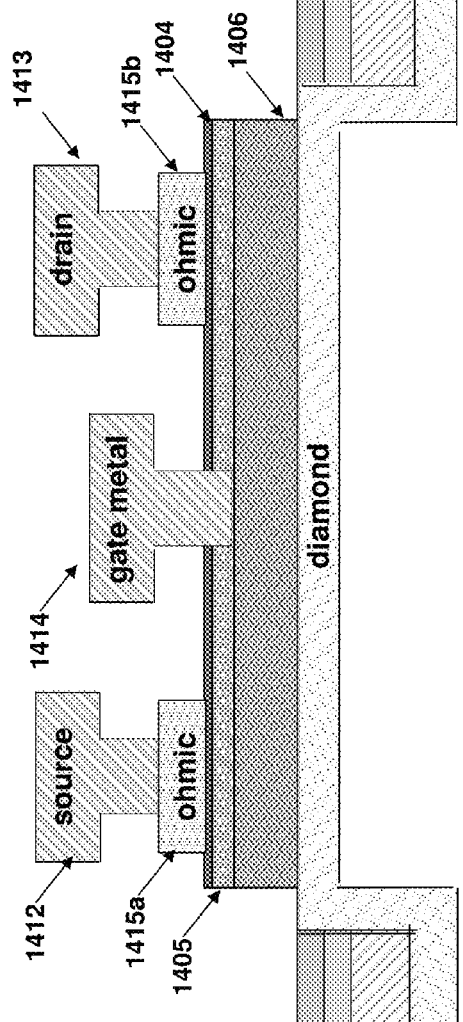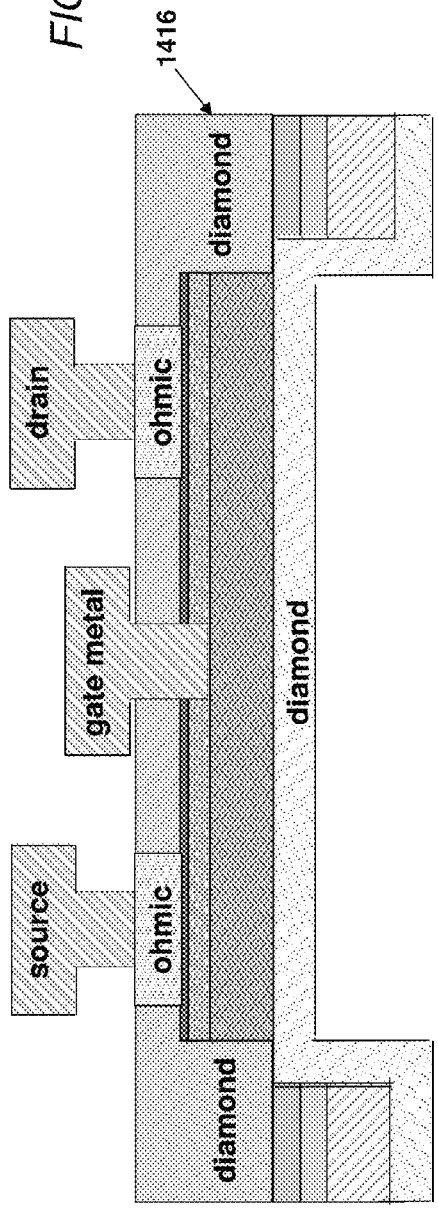

SEMICONDUCTOR STRUCTURE OR DEVICE INTEGRATED WITH DIAMOND

CROSS-REFERENCE

This application is a Nonprovisional of and claims the benefit of priority under 35 U.S.C. §119 based on U.S. Provisional Patent Application No. 61/717,678 filed on Oct. 24, 2012, the entirety of which is hereby incorporated by reference into the present application.

TECHNICAL FIELD

The present invention relates to semiconductor structures and semiconductor devices, specifically structures and devices having one or more diamond layers integrated therein.

BACKGROUND

Group III-nitride based high electron mobility transistors (HEMTs) are attracting significant interest for microwave and power switching applications. The power capability and reliability of III-nitride transistors is strongly dependent on the channel temperature and/or junction temperature of the III-nitride transistor. A high channel and/or junction temperature can degrade the performance of the transistor due to an increase in phonon scattering and also accelerate failure mechanism. The thermal conductive of the substrate strongly affects the thermal resistance from the channel and junction region to heat sink on the bottom side of the device. Thus, it is advantages to use a high thermal conductivity substrate to minimize the channel and junction temperature. Diamond can have thermal conductivities of approximately 2000 W/mK and is thus a desirable substrate to reduce the thermal resistance from the channel region to the heat sink.

A semiconductor integrated within one or more diamond material layers in accordance with the present invention can provide significantly improved thermal management, including extremely high thermal conductivity for very high-power GaN transistors, which can enable a transistor with high microwave output power levels, a light emitting device with high light emission flux, or a power switching devices with high current capability while maintaining the device channel or junction temperature at a temperature which will not accelerate reliability failure mechanisms. Alternately, the improved thermal management provided by integrated diamond layers can lower the channel and junction temperature, providing improved reliability.

Diamond has a very low thermal expansion coefficient of approximately $1.0 \times 10^{-6}$ $K^{-1}$ at 300 C. Gallium nitride has a thermal expansion coefficient of approximately $5.6 \times 10^{-6}$ $K^{-1}$ at 300 C. Thus, there is a very large difference in thermal expansion coefficients between diamond and gallium nitride.

The epitaxial material for a III-nitride HEMT are often grown to have a gallium-polar (metal-polar) (0001) surface but can be grown to have a nitrogen polar GaN (000"1) surface. The gallium-polar (metal-polar) (0001) surface and the nitrogen-polar (000"1) surfaces have negative and positive fixed spontaneous polarization sheet charges, respectively. The III-nitride epitaxial material are typically grown on a sapphire, silicon carbide, silicon, or gallium nitride substrate. For the sapphire, silicon carbide, and silicon substrates, a III-nitride nucleation layer is typically initially grown on the substrate to obtain III-nitride epitaxial material growth with a gallium-polar (metal-polar) (0001) surface. The III-nitride nucleation layer is often a low temperature grown AlN layer but can also be high temperature AlN layer, TiN, nanocrystalline material, or other material known to those skilled in the art.

In the III-nitride HEMT, a barrier material layer grown on a GaN surface with gallium-polar (0001) surface will induce a two-dimensional electron gas (2DEG) at the interface of the barrier material layer with the GaN material due to strain induced piezoelectric effect and/or the spontaneous polarization effect at the barrier material layer/GaN interface. Because of the strain induced piezoelectric effect, the magnitude and type of strain (whether tensile or compressive) can influence the density of carriers in the 2DEG and the threshold voltage of the III-nitride HEMT device. The strain at the barrier material layer/GaN interface is thus an important parameter for III-nitride HEMT devices.

An important parameter for III-Nitride High Electron Mobility Transistors (HEMT) is the thermal boundary resistance at the III-Nitride semiconductor material/substrate interface. The substrate for III-Nitride HEMTs are typically sapphire, silicon carbide, or silicon. The thermal boundary resistance is increased by the presence of an III-nitride nucleation layer at the III-nitride/substrate interface and also the defective III-nitride semiconductor material adjacent to the III-nitride nucleation layer. A. Manoi, J. W. Pomeroy, M. Killat, and M. Kuball, "Benchmarking of Thermal Boundary Resistance In AlGaN/GaN HEMTs on SiC Substrates: Implications of the Nucleation Layer Microstructure," IEEE ELECTRON DEVICE LETTERS, VOL. 31, NO. 12, DECEMBER 2010, pp. 1395-1397.

Fusion or direct bonding directly bonds two wafers that are initially only connected by the weak atomic forces (van der Waals forces) of hydroxyl (OH) groups in the interface (borderline) layer between the two wafers. By subsequently applying heat, covalent bonds are formed between the two wafers. This is a very strong, non-soluble bonding of the two wafers and is suitable for high temperature processing of the wafer pair. The surface of wafers will typically be prepared to be hydrophilic for direct or fusion bonding, especially if the wafers have a dielectric or oxide layer on the surface. It is also possible to have hydrophobic wafer direct bonding for the case that a silicon surface is hydrogen terminated. The surface of the two wafers can be exposed to a plasma to achieve improved direct or fusion bonding. Another type of bonding is adhesive bonding which typically uses polymers to adhere two wafers together. Adhesive or glue bonding is typically not suitable for high temperature processing because gases evolve from the polymer upon exposure to high temperature and the gases form bubbles in the adhesive layer which is undesirable for bonded wafer pairs.

Previous methods to integrate diamond on the second side of semiconductor material have involved bonding semiconductor material to a diamond substrate. The most common approach to bond the diamond substrate to the semiconductor material has involved using a bonding material adhere the semiconductor material to the diamond substrate. The use of the bonding material increases the thermal resistance from semiconductor material to the diamond substrate because of both the lower thermal conductivity of the bonding material compared to diamond and also the additional material interfaces increase the thermal resistance by causing additional phonon scattering. See, e.g., D. Francis, F. Ejeckam, J. Wasserbauer, and D. Babic, "Semiconductor devices having gallium nitride epilayers on diamond substrate, U.S. Pat. No. 8,283,672, Oct. 9, 2012; D. Francis, F. Ejeckam, J. Wasserbauer, D. Babic, "Method for manufacturing semiconductor devices having gallium nitride epilayers on diamond substrates," U.S. Pat. No. 8,283,189, Oct. 9, 2012; D. Francis, F. Ejeckam, J. Wasserbauer, D. Babic, "Semiconductor devices having gallium nitride epilayers on diamond substrates," U.S. Pat. No. 7,595,507, Sep. 29, 2009; K. Cheng, M. Leys, S. Degroote, "Method for forming a group III nitride material on a silicon substrate," U.S. Pat. No. 7,989,925, Aug. 2, 2011; and F. J. Kub and K. D. Hobart, "Gate after diamond transistor," U.S. Pat. No. 8,039,301, Oct. 18, 2011.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides semiconductor devices that include a semiconductor structure integrated with one or more diamond material layers.

In some embodiments, a first diamond material layer is formed on a second side (bottom surface) of the semiconductor structure, while in other embodiments the first diamond material layer is also formed in side regions (mesa isolation regions) adjacent to the sides of the semiconductor structure with the sides of the semiconductor structure approximately perpendicular to the second side.

In some embodiments, the lateral length of the semiconductor material structure is selected to reduce the compressive strain that is imparted to the semiconductor material structure by the thermal coefficient of expansion mismatch between the semiconductor material structure and the first diamond material layer.

In some embodiments, a semiconductor device such as a III-nitride high electron mobility transistor (HEMT) can be formed on a first side of the semiconductor material structure opposite the second side, with the lateral length of the semiconductor material structure being configured so that the device ohmic contacts or device electrical electrode contact are in contact only with the semiconductor structure; in other embodiments, the lateral length of the semiconductor structure is configured so that one or more ohmic contacts of the device partially overlap onto the diamond mesa isolation region, thereby contacting the diamond in addition to contacting the semiconductor structure.

In some embodiments, the first diamond material layer is in direct contact with the semiconductor structure, while in other embodiments, the first diamond material layer is in contact with a diamond nucleation layer that is formed on the second side of the semiconductor structure (and optionally also in the side regions.)

In some embodiments, the semiconductor structure includes one or more layers of III-nitride material. In some embodiments, the first diamond material layer is formed on a III-nitride material semiconductor structure, while in other embodiments, the first diamond material layer is formed on a diamond nucleation layer that is formed on a III-nitride material semiconductor structure. In some embodiments, the III-nitride nucleation layer and/or portion of GaN is etched prior to deposition of first diamond material layer and the first diamond material layer is in direct contact with the GaN or the diamond nucleation layer that has as one advantage a reduction of the thermal boundary resistance. In some embodiments, the first diamond material layer has sufficient thickness and mechanical strength to provide mechanical support for multiple semiconductor material structures. In some embodiments, a hydrogen etch protection material layer can be deposited on the second side of the semiconductor structure prior to deposition of the diamond nucleation layer or the first diamond material layer growth.

In some embodiments, there is no first diamond material layer in the adjacent semiconductor material structure side regions, some partial portion of the perpendicular semiconductor material structure side that has the first diamond material layer adjacent to the side, or the first diamond material layer is entirely in the side region. In various embodiments, the semiconductor material structure is not embedded, is partially embedded, or is completely encased or embedded within the first diamond material layer.

In some embodiments, the material structure can comprise multiple semiconductor material structure in contact with and mechanically supported by a first diamond material layer or a diamond composite substrate. In some embodiments, a device can comprise multiple semiconductor material structures on a first diamond material layer or a diamond composite substrate. In some embodiments, a field effect transistor can comprise multiple semiconductor material structures on a first diamond material layer or diamond composite substrate with the field effect transistor source and drain contacts with more than one semiconductor material structure and the transistor gate electrode modulating the current flow from source to drain electrodes. In some embodiments, a circuit can comprise multiple semiconductor material structures on a first diamond material layer or a diamond composite substrate.

In some embodiments, a second diamond material layer can be formed on the first side of the semiconductor structure so that the semiconductor device is partially or completely encased or embedded within diamond material, with the semiconductor structure being optionally separated from the second diamond material layer by a layer of a protective material such as SiN. In some such embodiments, the second diamond material layer makes thermal contact with the first diamond material layer in the mesa isolation region, while in other such embodiments, there is no first diamond material in the mesa isolation region so that the second diamond material layer extends along the perpendicular sides of the semiconductor structure to make thermal contact with the first diamond material layer.

The term "embedded" is used herein to refer to the case where at least a portion of the semiconductor material structure has diamond material on a bottom and at least a portion of the side surfaces thereof. The term "encased" is used herein to refer to the case where at least a portion of the semiconductor material structure has diamond material on a bottom, a top, and at least a portion of the side surfaces thereof.

In some embodiments, the structure also includes one or more channels etched into the first diamond material layer to provide for additional cooling of the device, e.g., by forced air or fluid flowing into the channels.

The present invention also includes methods for fabricating a semiconductor device integrated with one or more diamond material layers.

In some embodiments, the method includes forming a III-nitride semiconductor structure; bonding a handle substrate to a first side of the III-nitride material; optionally etching the structure to form mesa isolation regions on the perpendicular sides of the III-nitride semiconductor material thereof; growing the first diamond material layer on a second side of the semiconductor opposite the first side and, if present, in the mesa isolation regions; removing the handle substrate; fabricating a semiconductor device such as a HEMT on the first side of the semiconductor structure; and optionally growing a second diamond material layer on the first side of the semiconductor structure so that it contacts the first diamond material layer.

In other embodiments, the method includes forming a III-nitride semiconductor structure on a substrate, the III-nitride semiconductor material structure optionally including, near the second side of the semiconductor material structure, one or more strain relief layers and a III-nitride nucleation layer; bonding a handle substrate to a first side of the III-nitride material; etching a single trench in a center area of the substrate and extending the trench into the nucleation layer and the one or more strain relief layers; growing a first diamond material layer in the trench; removing the handle substrate; fabricating a semiconductor device such as a HEMT on the first side of the semiconductor structure; and optionally growing a second diamond material layer on the first side of the semiconductor structure so that it contacts the first diamond material layer.

The one or more strain relief layers can be implemented as stacked III-nitride epitaxial layers. The presence of multiple material interfaces in the stacked III-nitride epitaxial layers can cause increased phonon scattering and thus, a reduction in the thermal conduction of heat for transport of heat from the frontside of the semiconductor material structure to the backside of the semiconductor material structure. It can thus be desirable to remove the one or more strain relief layers by etching from the second side after the substrate is removed to improve the thermal conduction (reduce the thermal boundary resistance) for heat generated in devices on the front side of the semiconductor material structure to a first diamond material layer on the backside of the semiconductor material structure. In a similar way, it can also be desirable to remove the III-nitride nucleation layer and defective III-nitride material by etching from the second side after the substrate is removed to improve the thermal conduction (reduce the thermal boundary resistance) of heat generated by devices on the first side of the semiconductor material structure to the first diamond material layer on the on the second side of the semiconductor material structure.

A semiconductor integrated within one or more diamond material layers in accordance with the present invention can provide significantly improved thermal management, including extremely high thermal conductivity for very high-power GaN transistors.

BRIEF DESCRIPTION OF THE DRAWINGS

FIGS. 13A-13I are block diagrams illustrating aspects of an embodiment of a method for fabricating a semiconductor structure integrated within a diamond material layer in accordance with one or more embodiments of the present invention.

FIGS. 14A-14H are block diagrams illustrating aspects of another embodiment of a method for fabricating semiconductor structure integrated within a diamond material layer in accordance with one or more embodiments of the present invention.

DETAILED DESCRIPTION

Figure 1:
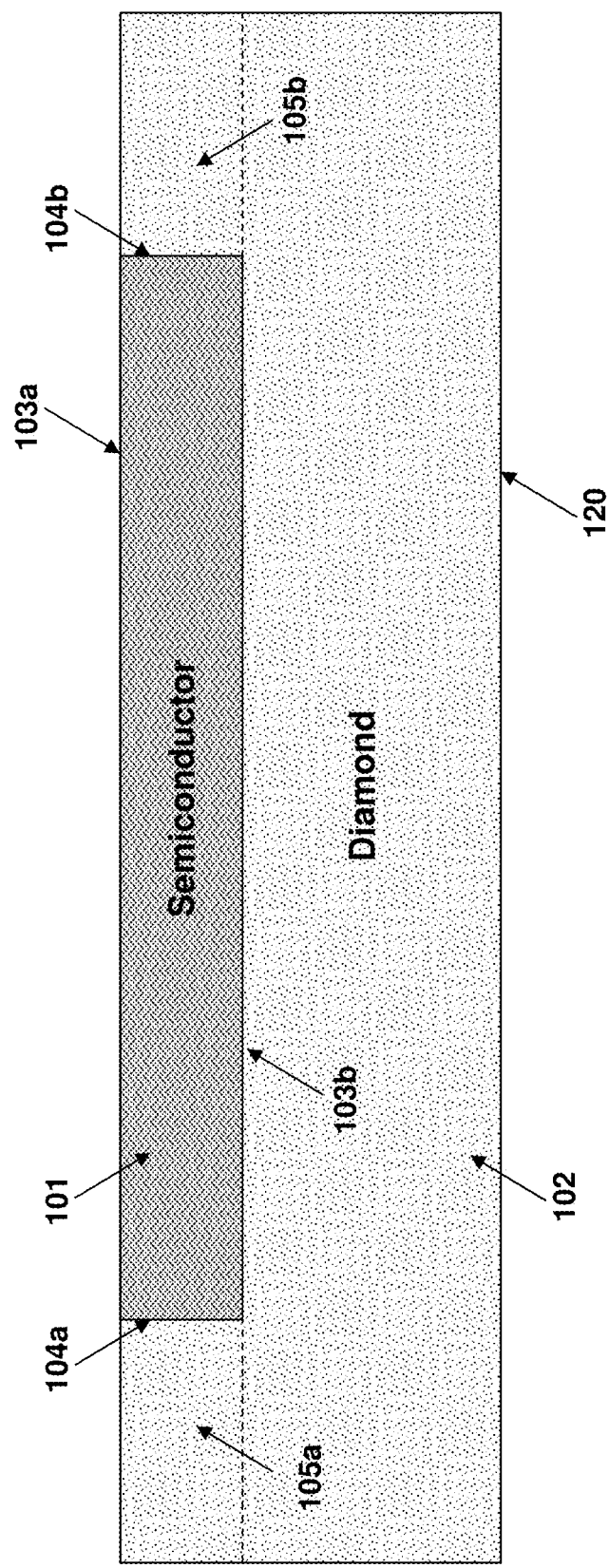
FIG. 1 is a block diagram illustrating overall aspects of a semiconductor structure integrated within a diamond material layer in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides semiconductor devices that include a semiconductor structure integrated with one or more diamond material layers.

It should be noted here that although the integrated semiconductor material will often be described herein as a "III-nitride" material, the semiconductor material used for any one or more of the semiconductor material layers is not limited to such III-nitride materials, and any other appropriate semiconductor material can also be used for one or more semiconductor material layers, and use of such other materials are also within the scope of the present disclosure.

Thus, a structure in accordance with the present invention can include a semiconductor material integrated with diamond or a device on or within a semiconductor material integrated with diamond.

As described in more detail below, integrating semiconductor material and/or device with diamond material (semiconductor diamond structure) means:

embedding semiconductor material and/or device within a diamond material layer (substrate) or diamond composite substrate;

encasing semiconductor material and/or device within a diamond material layer (substrate) or diamond composite substrate; or depositing/growing diamond on a semiconductor material and/or device (with the device within or on semiconductor material) with the diamond forming a substrate or a layer within a diamond composite substrate. The diamond material layer/substrate can be deposited on the second side (sometimes referred to herein as the "back" or "bottom" side or surface) of the semiconductor material and optionally on the perpendicular sides in the side regions (sometimes referred to herein as the "mesa isolation regions") and/or the first side (sometimes referred to herein as the "front" or "top" side or surface) of the semiconductor material and/or device.

It will be noted here that unless specifically stated otherwise, as used herein, the term "deposited" when referring to a diamond or any other layer in a structure as described herein will refer to any suitable form of disposition of one layer of material on another known in the art, such as microwave plasma chemical vapor deposition, hot filament chemical vapor deposition, ultrasonic deposition of nanocrystalline diamond nucleation nanoparticles, or chemical vapor deposition growth. In addition, the diamond material layer/substrate can be shaped after growth by grinding and/or polishing to meet the requirements for backside smoothness, Total Thickness Variation (TTV), mechanical strength, and any other desired parameters.

Devices that can be embedded or encased with in diamond substrate or composite substrate include but are not limited to III-nitride high electron mobility transistors (HEMTs), GaN HEMTs, GaN field effect transistors, GaN light emitting devices, GaN lasers, GaN diodes, GaN photoconductors, and GaN bipolar transistors.

The term "embedded" is used herein to refer to the case where at least a portion of the semiconductor material structure has diamond material on a bottom and at least a portion of the side surfaces thereof. The term "encased" is used herein to refer to the case where at least a portion of the semiconductor material structure has diamond material on a bottom, a top, and at least a portion of the side surfaces thereof.

The lateral length of the semiconductor material structure is generally meant to be the smallest length or dimension of a semiconductor material structures in a direction parallel to the second side of the semiconductor material structure. For field effect transistor device, the smallest lateral length of the semiconductor material structure is often in a direction from the device source to the drain. It is possible for some embodiments for the smallest lateral length of the semiconductor material can be in a direction perpendicular to the source to drain direction (narrow width transistor). For other devices such as light emitting devices which are often implemented in semiconductor material structures having the form of a mesa, the smallest lateral length of the semiconductor material structure is the smallest dimension of the semiconductor material structure in a direction parallel to the second side.

As described in more detail below, in some embodiments, a first diamond material layer is formed on a second, or "bottom" side (or "surface") of the semiconductor structure, while in other embodiments the first diamond material layer is also formed in side regions (mesa isolation regions) extending along the semiconductor structure perpendicular to the second side.

In some embodiments, a semiconductor device such as a III-nitride HEMT can be formed on a first, or "top" side (or "surface") of the semiconductor structure opposite the second side, with the lateral length of the semiconductor structure being configured so that the device contacts only the semiconductor structure; in other embodiments, the lateral length of the semiconductor structure is configured so that one or more ohmic contacts of the device partially overlap onto the diamond mesa isolation region, thereby contacting the diamond. The lateral length of the semiconductor structure can also be selected to minimize, and in some embodiments, optimize, the device characteristics by the compressive strain imparted into the semiconductor material structure by the thermal expansion coefficient mismatch between the semiconductor structure material and the first diamond material layer.

In some embodiments, the III-nitride nucleation layer and/or a portion of a III-nitride material layer (GaN) can be etched on the exposed second side of the semiconductor material prior to the deposition of an optional diamond nucleation layer or the growth of a first diamond material on the second side of the semiconductor material to reduce the thermal boundary resistance for heat generated by a device formed within or on the semiconductor material into the first diamond material layer.

In some embodiments, a hydrogen etch protection layer can be deposited on the second side of the semiconductor material prior to the deposition of the optional nanocrystalline diamond layer or the growth of the first diamond material layer on the second side of the semiconductor material.

In some embodiments, a second diamond material layer can be formed on the first side of the semiconductor structure so that the semiconductor device is partially or completely encased within diamond, with the semiconductor structure being optionally separated from the second diamond material layer by a protective material layer. In some such embodiments, the second diamond material layer makes thermal contact with the first diamond material layer in the mesa isolation region (side region), while in other such embodiments, there is no first diamond material in the mesa isolation region and the second diamond material layer is within the mesa isolation regions (side regions) and makes a direct diamond to diamond contact to the first diamond material layer. In some embodiments, the second diamond material layer can extends along the perpendicular sides of the semiconductor structure to make thermal contact with the first diamond material layer.

In some embodiments, the structure also includes one or more channels etched into the first diamond material layer to provide for additional cooling of the device, e.g., by forced air or fluid flowing into the channels.

The present invention also includes methods for fabricating a semiconductor device integrated with one or more diamond material layers.

In some embodiments, the method includes forming a III-nitride semiconductor structure; bonding a handle substrate to a first side of the III-nitride material; optionally etching the structure to form mesa isolation regions on the perpendicular sides thereof; growing the first diamond material layer on a second side of the semiconductor opposite the first side and, if present, in the mesa isolation regions; removing the handle substrate; fabricating a semiconductor device such as a HEMT on the first side of the semiconductor structure; and optionally growing a second diamond material layer on the first side of the semiconductor structure so that it contacts the first diamond material layer.

In other embodiments, the method includes forming a III-nitride semiconductor structure on a substrate, the III-nitride semiconductor material structure optionally including near the second side of the semiconductor material structure one or more strain relief layers and a III-nitride nucleation layer; bonding a handle substrate to a first side of the III-nitride material; etching a single trench in a center area of the substrate and extending the trench into the nucleation layer and the one or more strain relief layers; growing a first diamond material layer in the trench; removing the handle substrate; fabricating a semiconductor device such as a HEMT on the first side of the semiconductor structure; and optionally growing a second diamond material layer on the first side of the semiconductor structure so that it contacts the first diamond material layer.

A semiconductor integrated within one or more diamond material layers in accordance with the present invention can provide significantly improved thermal management, including extremely high thermal conductivity for very high-power GaN transistors, which can enable microwave transistors with higher output power or light emitting devices with higher light emission without an increase in the device junction temperature. The reliability of a device can degrade if the junction temperature or channel temperature is at too high of a temperature. The reliability of a device is typically improved by operating the device with a lower junction temperature or channel temperature. Alternately, a microwave transistor or light emitting device can have a lower junction temperature for a given level of output, which typically results in higher reliability.

These and other aspects of the present invention will now be described with reference to the FIGURES described above which are hereby incorporated into and form a part of the present disclosure. It will be noted that in many cases, where the same structures are illustrated in more than one FIGURE, the corresponding structures are given the same reference numbers, differing only by the first one or two digits (as appropriate) which denote the FIGURE number. See e.g., first diamond material layer 102 shown in FIG. 1 and corresponding first diamond material layer 202 shown in FIG. 2. In addition, in some FIGURES, to avoid unnecessary repetition of elements that have been shown/described with reference to previous FIGURES, only elements that are newly shown or specifically described with respect to that FIGURE are numbered.

FIG. 1 is a block diagram illustrating general aspects of a structure in accordance with the present invention. As illustrated in FIG. 1A, such a structure includes a semiconductor material 101, the semiconductor material having a first side 103a, a second side 103b, and perpendicular sides 104a/104b, and also includes a first diamond material layer 102 deposited on the second side 103b such that a first surface of the first diamond material layer is in contact with the semiconductor material. First diamond material layer 102 can be deposited on a semiconductor material having a fully fabricated semiconductor device such as a high electron mobility transistor (HEMT) on the first side 103a thereof, on a semiconductor material having no device thereon, or on a semiconductor material having a partially fabricated device. In addition, in some embodiments, optional mesa isolation regions 105a and 105b can be etched from semiconductor material layer 101, with first diamond material layer 102 being disposed within the mesa isolation regions such that the first diamond material is in contact with the perpendicular sides 104a/104b of the semiconductor material. In some embodiments, the optional mesa isolation regions 105a and 105b can be etched through the semiconductor material layer 101, with a dielectric layer such as silicon oxide, silicon nitride, spin-on-glass, or other material known to those skilled in the art being disposed with the mesa isolation regions. In some embodiments, the optional mesa isolation region can have a stacked structure having a combination or dielectric layer and first diamond material layer. In some embodiments, there is no first diamond material layer in the adjacent semiconductor material structure side regions, some partial portion of the perpendicular semiconductor material structure side that has the first diamond material layer adjacent to the side, or the first diamond material layer is entirely in the side region. In some embodiments, the semiconductor material structure is not embedded, partially embedded, or completely embedded within the first diamond material layer.

First diamond material layer 102 can be in the form of a diamond composite substrate such as a layered structure having the first diamond material layer in contact with the semiconductor material structure and one or more materials that include, but are not limited to GaN, HVPE GaN, AlN, HVPE AlN, AlGaN, HVPE AlGaN, polysilicon, aerosol deposition method nanoceramic material, and combinations of such materials, deposited on the second side of the first diamond material layer. In certain embodiments, it is desirable that the deposited material have high thermal conductivity. In certain embodiments, especially for microwave applications, the material should be insulation or semi-insulation. The composite layer/substrate can be shaped after growth by grinding and/or polishing to meet the requirements for backside smoothness, TTV, mechanical strength, and other parameters desired for a substrate.

In some embodiments, the diamond material for first diamond material layer 102 can be selected to be insulating, while in other embodiments, it can be selected to be P-type doped. An insulating first diamond material layer is often preferred for device structures such as microwave III-nitride HEMT, while a P-type doped first diamond material layer may be preferable for power switching devices, power diode, or light emitting diode structures.

As noted above, a first surface of first diamond material layer 102 contacts the second side 103a of the III-nitride semiconductor material layer. The second surface 120 of the first diamond material layer 102, opposite the first surface, is typically prepared to facilitate bonding first diamond material layer 102 to a heat sink or to an isolation material such as an AlN ceramic substrate or BeO ceramic substrate, described in more detail below. Because of the larger thermal coefficient of expansion mismatch, it is often difficult to have metals adhere to the diamond after thermal cycling, and so to facilitate this, titanium metal is typically deposited on second surface 120 of first diamond material layer 102 to obtain sufficient adhesion of the metal to the diamond. Additional solderable metals can optionally be deposited on the titanium metal, with a gold-tin solder typically used to bond the solderable metal to a heat sink or to a metallized ceramic insulation layer.

As described further below, the lateral dimension of semiconductor material layer 101 can be selected for the amount of strain that is induced in the semiconductor material by being in contact with the first diamond material layer. The semiconductor material and the diamond material will have different thermal coefficient of expansion values and thus a strain will be established in the semiconductor material that can affect device properties. Because the diamond has a low thermal expansion coefficient, the strain induced in the semiconductor material will be a compressive strain.

In many cases, depending on the device operation considerations, it is desirable to minimize the compressive strain in the semiconductor material, and in such cases, the lateral dimension of the semiconductor material can be configured to minimize the compressive strain in the semiconductor material. For example, for a semiconductor material structure with gallium-polar (metal-polar) (0001) surface, the additional compressive strain imparted to the semiconductor material layer and thus into a GaN layer adjacent to the second side of the barrier material layer would decrease the carrier density in the 2DEG in channel layer for an inverted AlGaN/GaN HEMT. Also, for a semiconductor material structure with nitrogen-polar (000"1) surface, the additional compressive strain imparted to the semiconductor material layer and thus into a GaN layer adjacent to the second side of the barrier material layer would decrease the carrier density in the 2DEG in channel layer for an inverted AlGaN/GaN HEMT.

In other cases, it may be desirable to increase the lateral dimension so that increased compressive strain is induced in the semiconductor material. For example, for a semiconductor material structure with gallium-polar (metal-polar) (0001) surface, the additional compressive strain imparted to the semiconductor material layer and thus into a GaN layer adjacent to the second side of the barrier material layer would increase the carrier density in the 2DEG in channel layer for an inverted AlGaN/GaN HEMT. Also, for a semiconductor material structure with nitrogen-polar (000"1) surface, the additional compressive strain imparted to the semiconductor material layer and thus into a GaN layer adjacent to the second side of the barrier material layer would increase the carrier density in the 2DEG in channel layer for an non-inverted AlGaN/GaN HEMT.

Figure 2:
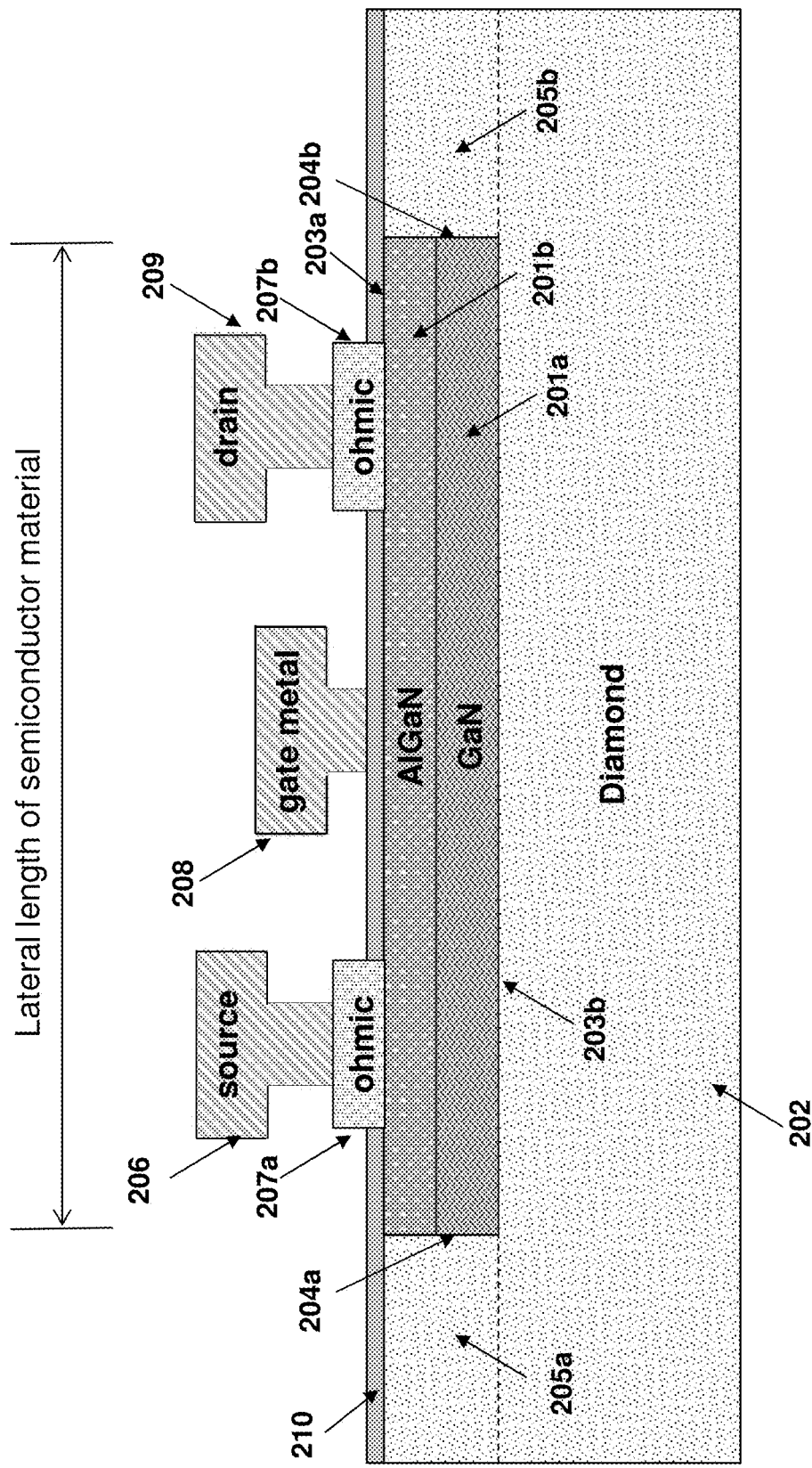
FIG. 2 is a block diagram illustrating aspects of a semiconductor structure integrated within a diamond material layer in accordance with an embodiment of the present invention.

FIG. 2 illustrates an exemplary embodiment of a semiconductor structure integrated with diamond in accordance with the present invention, where the structure includes a III-nitride HEMT on or within a III-nitride semiconductor material integrated with a first diamond material layer.

As illustrated in FIG. 2, in an exemplary embodiment, a semiconductor material having a first side 203a and a second side 203b can have a III-nitride HEMT or other device type fabricated on or within the semiconductor material on the first side 203a thereof and a diamond material layer on the second side 203b thereof. The semiconductor material can be III-nitride semiconductor material consisting of one or more III-nitride material layers such as GaN layer 201a and AlGaN layer 201b integrated with diamond material layer 202 deposited on the second side 203b of the semiconductor material. Diamond can also be deposited such that it contacts perpendicular sides 204a/204b of the semiconductor material in optional mesa isolation regions (side regions) 205a/205b. Methods of depositing diamond material layer 202, described in more detail below, include bias enhanced nucleation of diamond material or deposition of diamond nucleation material on the second side of the III-nitride material and growing diamond material using microwave plasma chemical vapor deposition, hot filament chemical vapor deposition or other diamond growth approaches known to those skilled in the art. The diamond nucleation material can comprise deposited nanocrystalline diamond nanoparticles, carbon material, carbide material, SiC material, silicon nitride layer, and other material layers for nucleating a diamond material layer known to those skilled in the art.

As noted above, a semiconductor structure in accordance with the present invention can include a semiconductor device such as a III-nitride HEMT fabricated on a first side of the semiconductor material layer, e.g., on AlGaN barrier material layer 201b shown in FIG. 2. Thus, as illustrated in FIG. 2, in some embodiments, a semiconductor device including source 206, ohmic contacts 207a/207b, gate metal 208, and drain 209 is fabricated on the first side 203a of the semiconductor material layer. In some embodiments, the gate electrode can overlap onto the side region of the first diamond material layer that is outside of the semiconductor material structure. In some embodiments, an optional protective layer 210 comprising silicon oxide, silicon nitride, silicon carbide, $Al_2O_3$, AlN, AlGaN, or other protective material layers can also be deposited on the first side 203a of the semiconductor material. The protective layer 210 can protect the III-nitride material layers from being etched by the hydrogen gas ambient in the diamond growth tool.

With respect to the dimensions of the first diamond layer 202, for microwave applications, it is often desirable that the thickness of first diamond material layer 202 be selected to be compatible with transmission lines formed on first diamond material layer 202 and/or on III-nitride semiconductor material 201a/201b. Typical thicknesses of diamond material layer 202 compatible with microwave transmission lines can be approximately 50 microns in one case, 100 microns in a second case, and alternate thickness for other designs for the microwave transmission lines. The thickness of first diamond material layer 202 can also be selected to provide a desired lowered thermal resistance of the diamond material layer. In such a case, first diamond material layer 202 can be initially grown thicker to facilitate handling during fabrication and then be thinned to a thickness compatible with microwave transmission lines or optimized thermal conductivity prior to bonding to a heat sink.

The lateral dimension of the semiconductor material layers 201a/201b can be selected for the amount of compressive strain that is induced in the III-nitride material by being in contact with the first diamond material layer. Thus, in the embodiment illustrated in FIG. 2, the semiconductor material layer 201a/201b is configured so that the source and drain ohmic contact metal (207a/207b) are completely situated within lateral dimensions of the III-nitride semiconductor material structure. For this embodiment, the lateral length of the semiconductor material structure must have sufficient dimension to contain the source and drain electrical ohmic contact. The compressive strain imparted to the semiconductor material structure by being in contact with the first diamond material layer is proportional to the lateral length of the semiconductor material structure and it can be desirable to select lateral dimensions of the components of the device structure to minimize the lateral length of the semiconductor material structure. In some such embodiments, the gate electrode can reside outside of the lateral dimensions of the III-nitride semiconductor material structure and overlap into the mesa isolation region.

Figure 3:
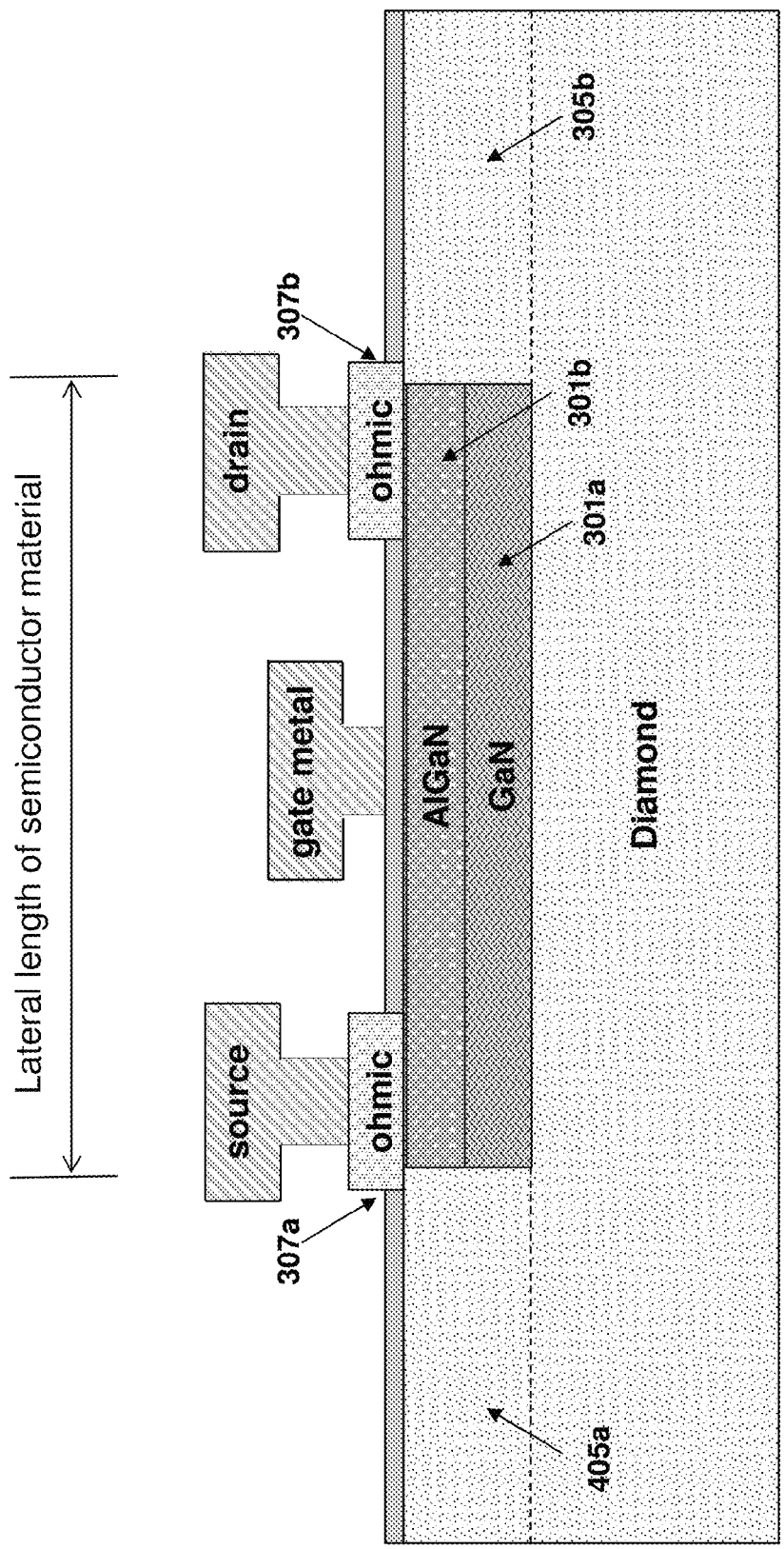
FIG. 3 is a block diagram illustrating aspects of a semiconductor structure integrated within a diamond material layer in accordance with one or more other embodiments of the present invention.

In another embodiment, aspects of which are illustrated in FIG. 3, the semiconductor material comprising GaN and AlGaN layers 301a and 301b, respectively, is configured so that the device metal electrode contacts and more specifically the device ohmic contacts 307a and 307b of the semiconductor device fabricated thereon partially overlap onto the diamond material in diamond mesa isolation regions (side regions) 405a/405b. The advantage of the ohmic contacts overlapping onto the diamond material in the diamond mesa isolation region is that the lateral length of the semiconductor material can be minimized so that the compressive strain imparted into the semiconductor material by being in contact with the first diamond material layer can be minimized. The amount of compressive strain that is imparted to the semiconductor material structure is increases approximately proportional to the lateral length of the semiconductor material structure.

The lateral length of the semiconductor material structure is generally meant to be the smallest length or dimension of a semiconductor material structures in a direction parallel to the second side of the semiconductor material structure. For field effect transistor device, the smallest lateral length of the semiconductor material structure is often in a direction from the device source to the drain. It is possible for some embodiments for the smallest lateral length of the semiconductor material to be in a direction perpendicular to the source to drain direction (narrow width transistor). For other devices such as light-emitting devices which are often implemented in semiconductor material structures having the form of a mesa, the smallest lateral length of the semiconductor material structure is the smallest dimension of the semiconductor material structure in a direction parallel to the second side.

Figure 4:
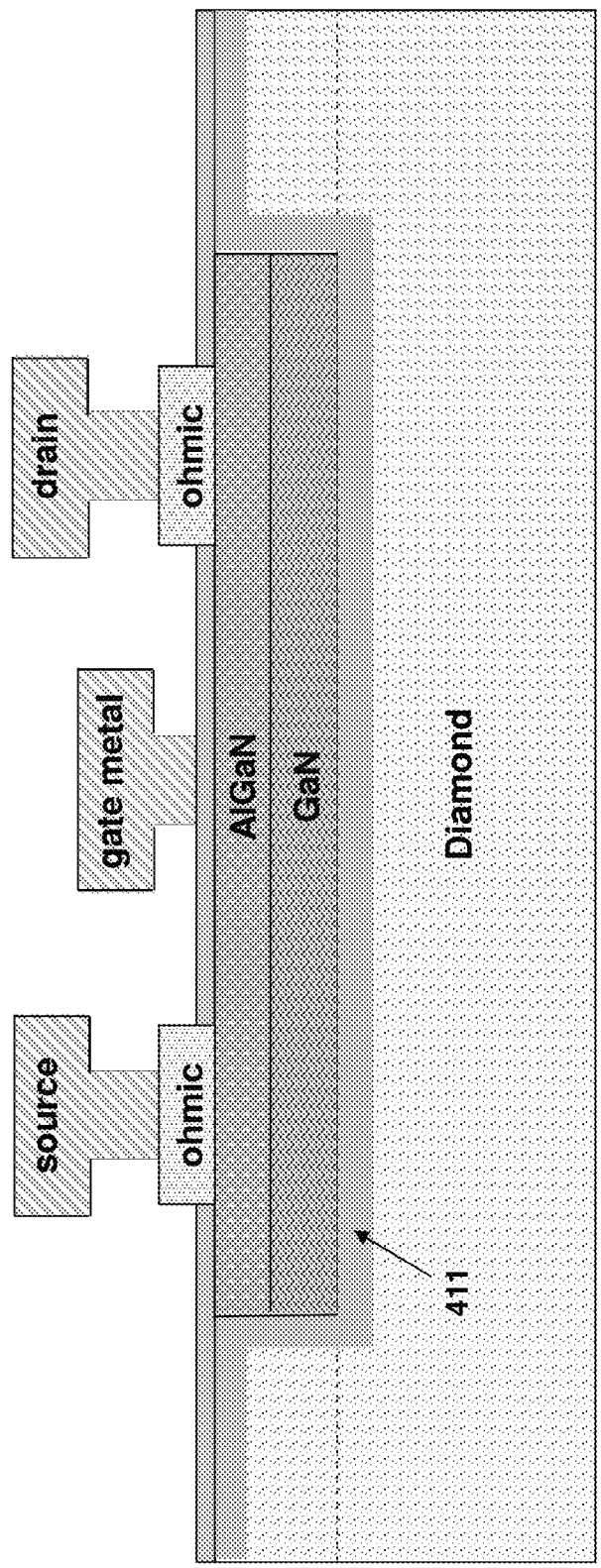
FIG. 4 is a block diagram illustrating aspects of a semiconductor structure integrated within a diamond material layer in accordance with one or more other embodiments of the present invention.

FIG. 4 illustrates aspects of another exemplary embodiment of a semiconductor device including a semiconductor material layer incorporated with diamond in accordance with one or more aspects of the present invention.

To avoid unnecessary duplication, it will be noted here that except as described, the embodiment illustrated in FIG. 4 and described herein includes the same elements as illustrated and described above with respect to FIG. 2, and such same elements are not numbered in FIG. 4 and will not be described here.

Thus, in the embodiment illustrated in FIG. 4, the diamond material layer can also comprise a diamond nucleation layer 411 together with one or more layers of diamond grown by different growth procedure to optimize the diamond thermal conductivity at or near the interface with the semiconductor material, obtain high growth rate, and/or reduce strain in the diamond material layer. In this embodiment, it is necessary to nucleate diamond on the second surface of the semiconductor material. A first technique to nucleate diamond on the semiconductor material layer is bias-enhanced nucleation, well-known in the art. Bias-enhanced nucleation of diamond is typically performed by applying a negative bias to a substrate which has been exposed to a plasma of methane and hydrogen at a selected gas pressure. The plasma can be the initial stage of a microwave plasma chemical vapor deposition diamond growth process. In a second technique to nucleate diamond on the semiconductor material layer, a layer of nanocrystalline diamond material is deposited on a surface, and the nanocrystalline diamond is used as a nucleation layer for growth of the diamond material layer CVD diamond growth processes such as hot filament diamond growth or microwave plasma assisted diamond growth.

Irrespective of how the diamond material layer is grown, it is desirable that the diamond material directly in contact with or near the interface of the diamond material layer and the second side of the semiconductor have high thermal conductivity. Thus, the initial diamond growth can be optimized for high thermal conductivity using techniques such as growing columnar diamond grain, growing diamond in a hydrogen-rich ambient, growing diamond at a slow growth rate, or growing diamond at a high temperature.

Figure 5:
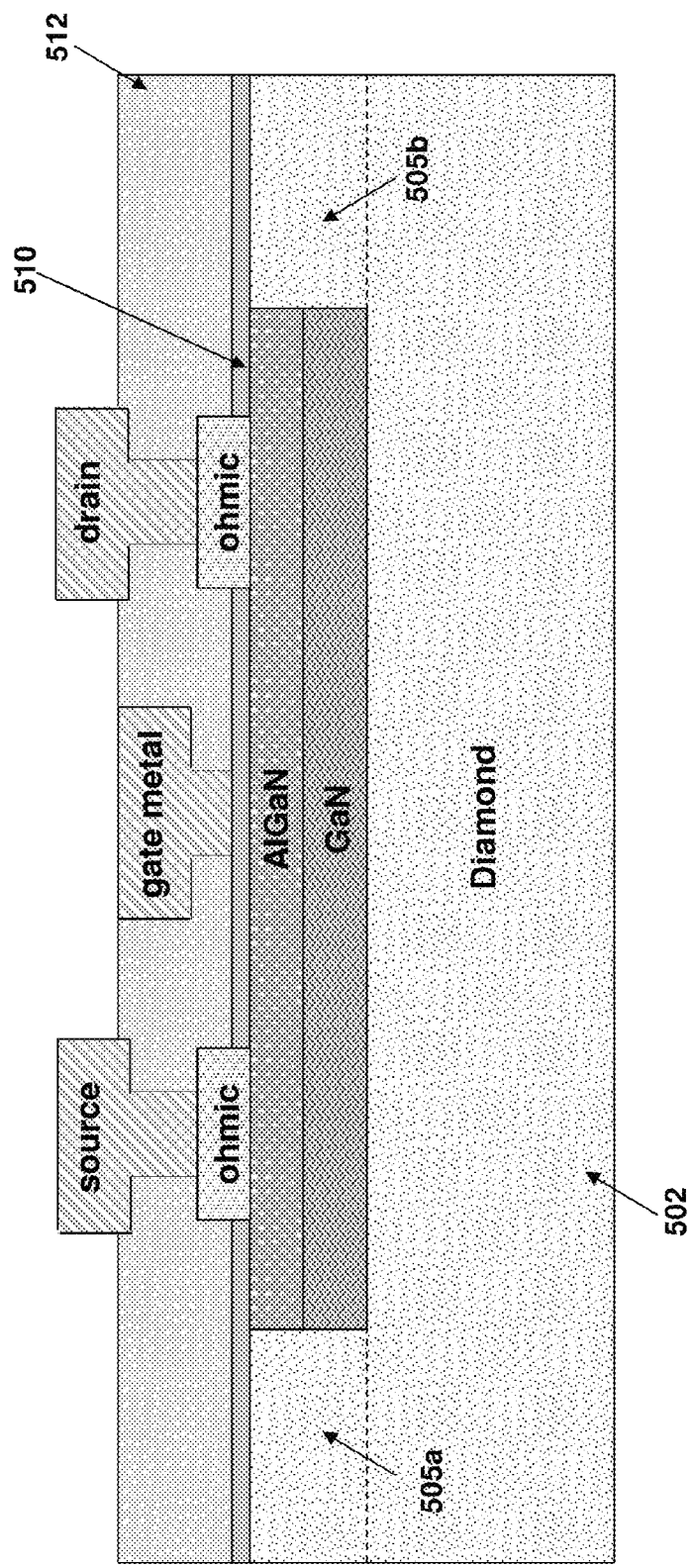
FIG. 5 is a block diagram illustrating aspects of a semiconductor structure integrated within a diamond material layer in accordance with one or more other embodiments of the present invention.
Figure 6:
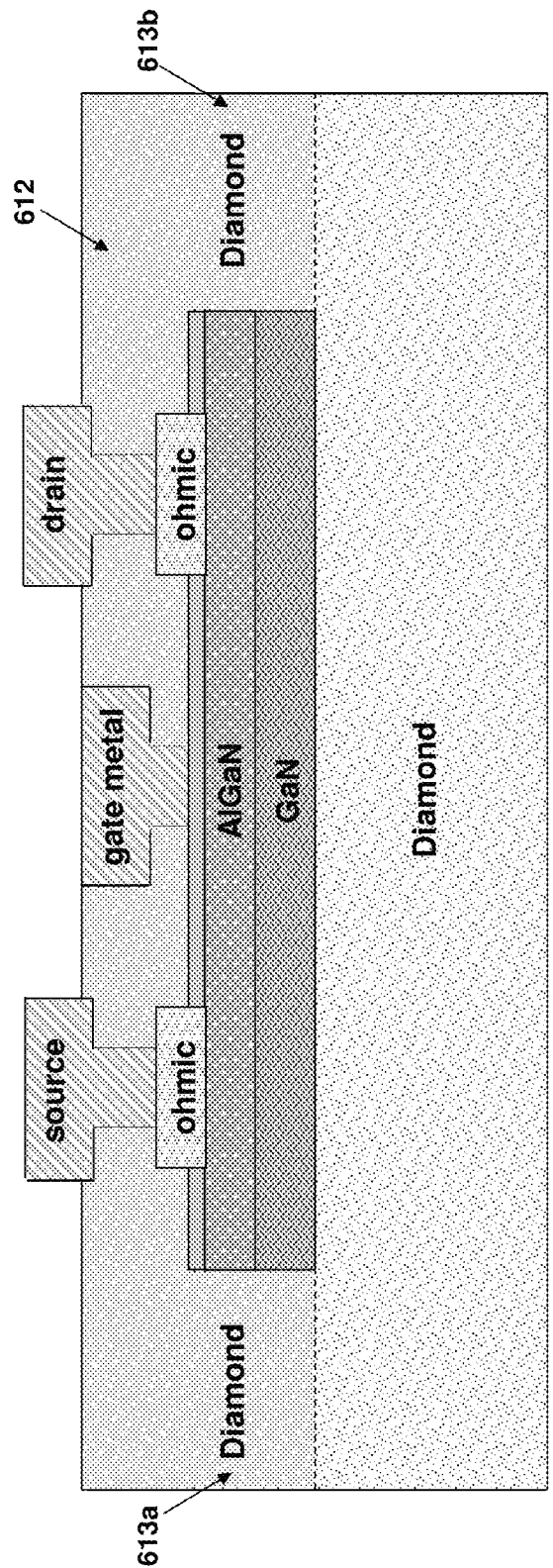
FIG. 6 is a block diagram illustrating aspects of a semiconductor structure integrated within a diamond material layer in accordance with one or more other embodiments of the present invention.

FIGS. 5 and 6 illustrate aspects of additional exemplary embodiments of a structure including one or more semiconductor material layers integrated with diamond in accordance with the present invention.

In the embodiment illustrated in FIG. 5, a second diamond material layer 512 can be deposited on the first side of a III-nitride material layer having no device, a partially fabricated device, or a completely fabricated device in or on its first side.

The second diamond material layer can be deposited before the gate formation or after the gate formation. In cases where the second diamond material layer is deposited after the gate formation, the gate material, gate material to semiconductor Schottky contact, optional insulator beneath the gate, and the ohmic contact metals should be selected to be compatible with the diamond material deposition temperature. The diamond material deposition temperature can typically be at a temperature greater than 700 C and thus, the device materials should be selected to be compatible with an exposure to temperature greater than 700 C. In cases where it is deposited before the gate, the second diamond material layer 512 can implement a diamond before gate III-nitride high electron mobility transistor (HEMT) similar to that described in U.S. Pat. No. 8,039,301 "Gate after Diamond Transistor," which shares two inventors in common with the present invention and which is hereby incorporated by reference into the present disclosure.

A direct contact between the first diamond material layer 502 and second diamond material layer 512 can be made in mesa isolation regions 505a/505b to achieve a low thermal resistance path for heat that is generated in by the device. Thus, the heat generated by the device can laterally spread in the second diamond material layer and then conduct through the direct diamond-to-diamond contact into the first diamond material layer. To make this direct contact between the first diamond material layer and the second diamond material layer, it can be desirable to remove the protective layer 510 in the mesa isolation region (side region). In addition to the lateral spreading of heat using the second diamond material layer, there can also be a vertical conduction of heat through the semiconductor material structure into the first diamond material layer in the region beneath the semiconductor material structure.

Alternatively, as illustrated in FIG. 6, if the fabrication process does not produce mesa isolation regions etched from the second side of the III-nitride material, mesas 613a/613b can be etched from the top side (first side) of the III-nitride material during the device fabrication process so that the second diamond material layer 612 extends over the side of the mesa etch from the topside and makes direct contact with the first diamond material layer.

Figure 7:
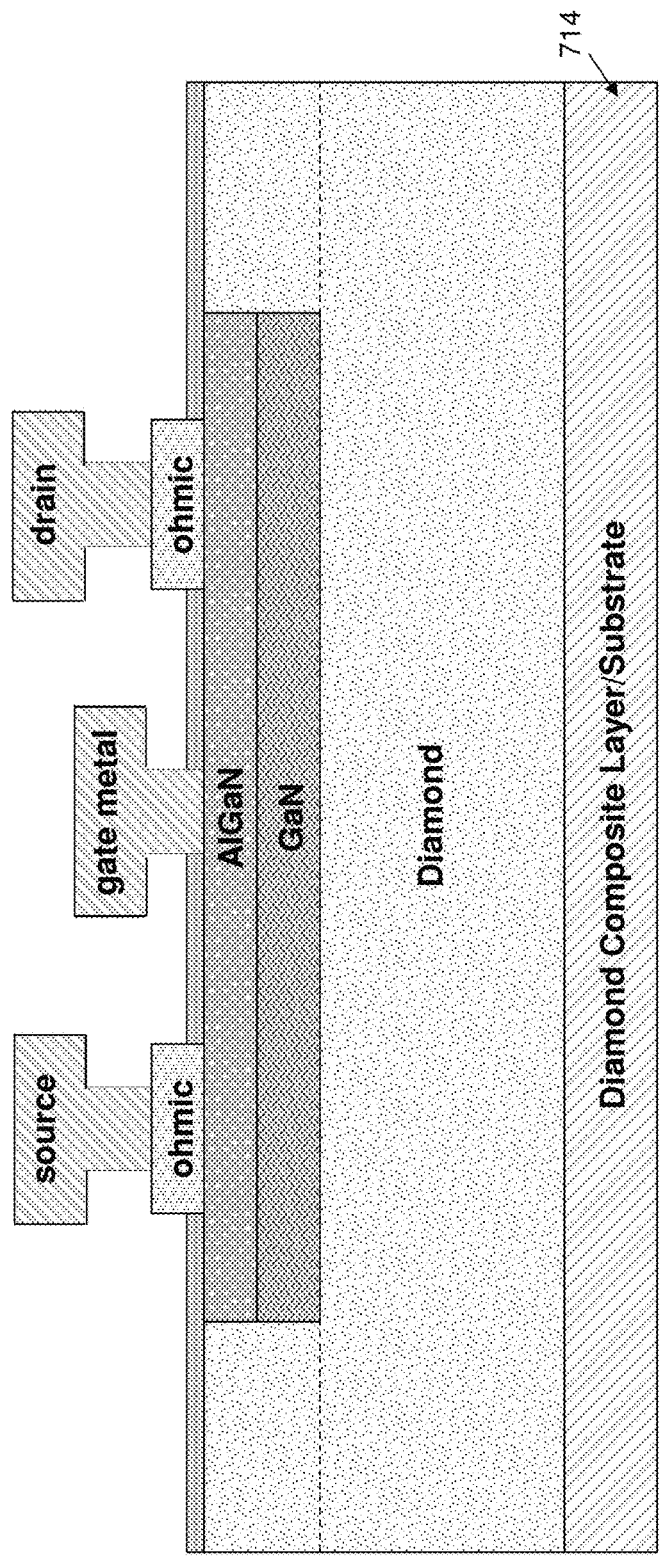
FIG. 7 is a block diagram illustrating aspects of a semiconductor structure integrated within a diamond material layer in accordance with one or more other embodiments of the present invention.

FIG. 7 illustrates aspects of another exemplary embodiment of a structure including one or more semiconductor material layers integrated with diamond in accordance with the present invention.

The process for growing diamond can require many hours of growth time and therefore can be very expensive. Moreover, the difference in the thermal coefficient of expansion between the handle substrate and the first diamond material layer can lead to substrate bowing after the handle substrate is removed. Consequently, in an embodiment of a structure in accordance with the present invention illustrated in FIG.

7, the first diamond material layer is thin, and a composite layer/substrate 714 can be formed by depositing or growing a material on the second side of the first diamond material layer. A first diamond material layer at the second side of the semiconductor material layer will increase the lateral spreading of the heat and thus provide a larger area for conduction of heat into the composite layer/substrate 714. This deposited/grown material in composite layer/substrate 714 can partially or fully compensate or reduce the bilayer strain of the handle substrate/semiconductor material/first diamond material layer structure and thereby help to reduce bowing in the composite substrate when the handle substrate is removed.

It is preferable that the deposited/grown material in composite layer/substrate 714 have high thermal conductivity. In addition, in certain embodiments, especially for microwave applications, the material should be insulating or semi-insulating. The material used for composite layer/substrate 714 can comprise GaN, HVPE GaN, AlN, HVPE AlN, AlGaN, HVPE AlGaN, polysilicon, aerosol deposition method nanoceramic material, and combinations of above materials. Composite layer/substrate 714 can be shaped after growth by grinding and/or polishing to meet the requirements for backside smoothness, TTV, mechanical strength, and other parameters desired for a substrate.

As noted above, for microwave applications, the material used for composite layer/substrate 714 should be insulating or semi-insulating. In many cases, it is also desirable that the thickness of composite layer/substrate 714 be selected to be compatible with transmission lines formed on the first side of the first diamond material layer and/or the III-nitride semiconductor. Suitable thicknesses of composite layer/substrate 714 compatible with microwave transmission lines have been found to be approximately 50 microns in one case and 100 microns in a another case, while other thicknesses may be suitable for other designs of the microwave transmission lines. In other embodiments, the thickness of composite layer/substrate 714 can be configured to lower the thermal resistance of the substrate. Composite layer/substrate 714 can also be initially grown thicker to facilitate handling during fabrication but then thinned to the thickness compatible with microwave transmission lines or optimized thermal conductivity prior to bonding to a heat sink.

In other cases it can be desirable that the first diamond material layer be thin but still be thick enough to perform as a heat spreader and to have low capacitance beneath the device electrode for good microwave performance.

Figure 8:
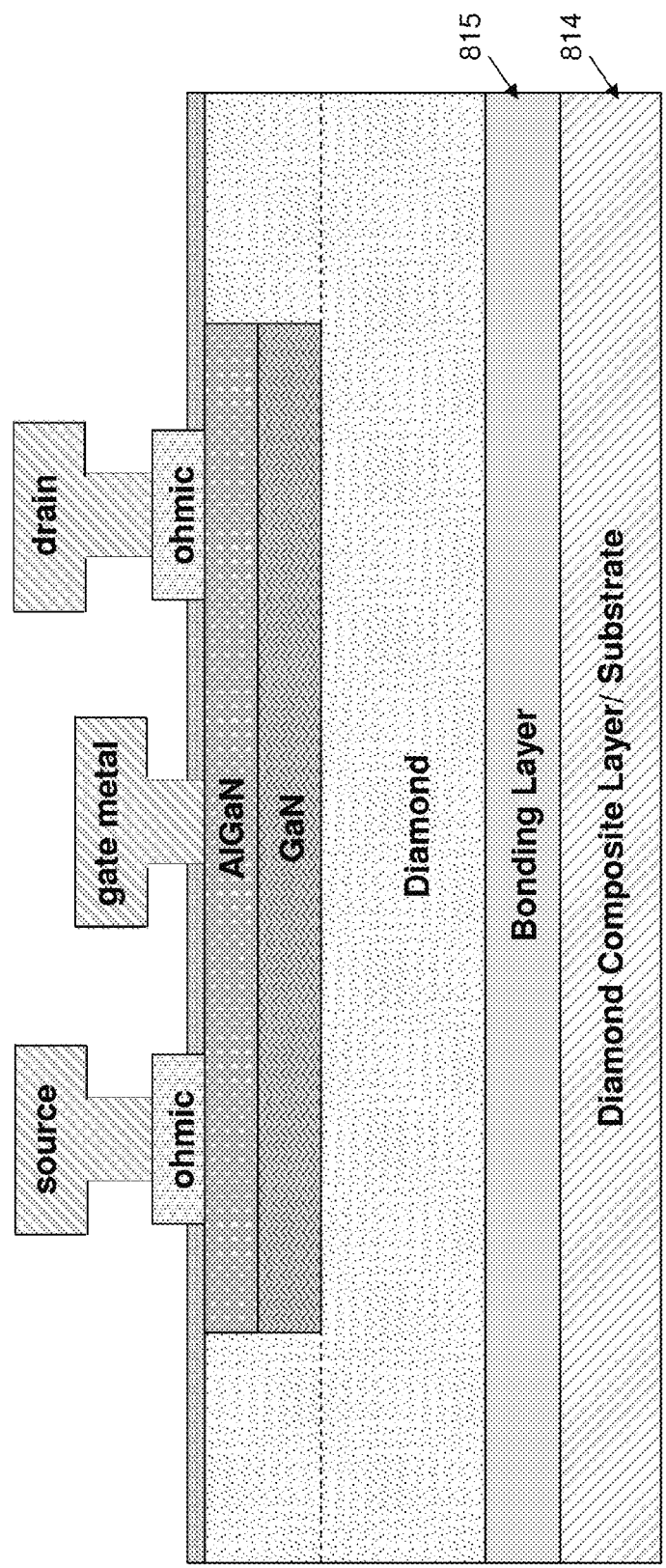
FIG. 8 is a block diagram illustrating aspects of a semiconductor structure integrated within a diamond material layer in accordance with one or more other embodiments of the present invention.
Figure 9:
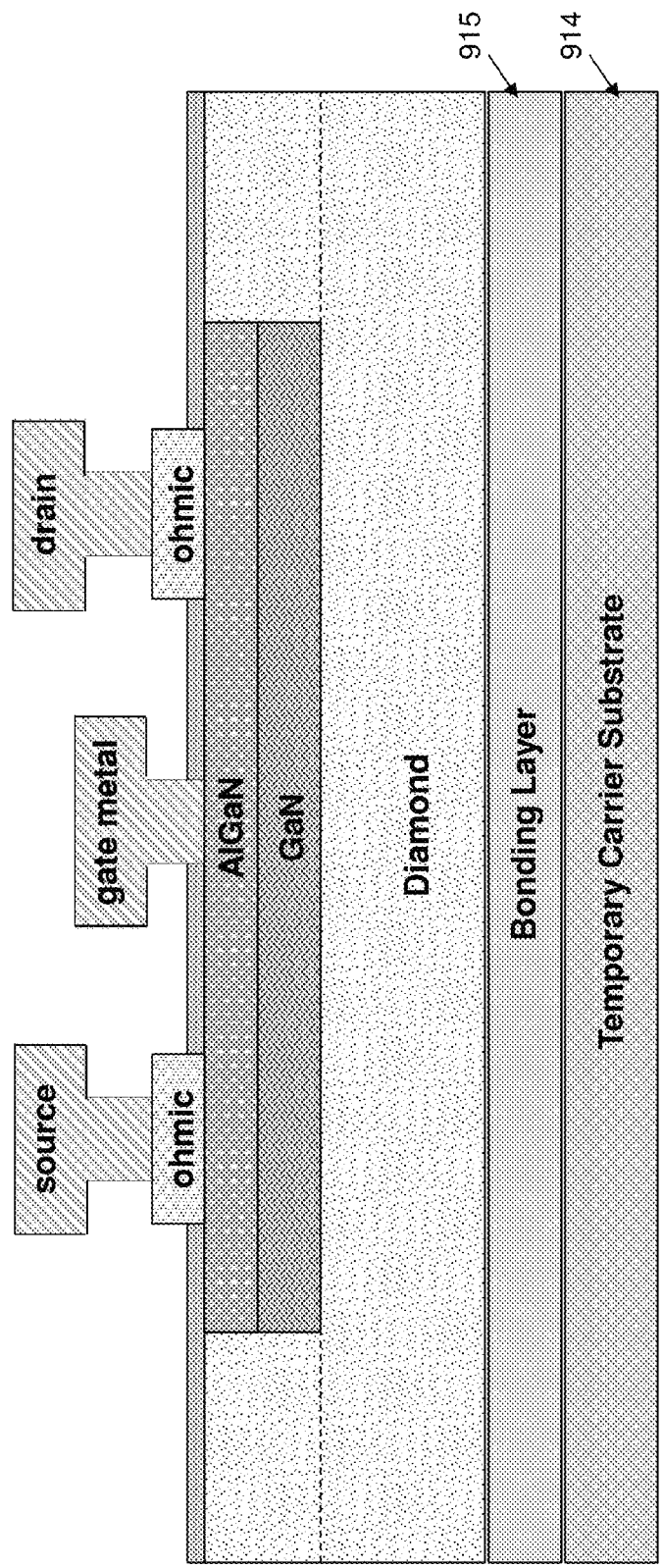
FIG. 9 is a block diagram illustrating aspects of a semiconductor structure integrated within a diamond material layer in accordance with one or more other embodiments of the present invention.

To achieve this, as illustrated in FIGS. 8 and 9, in some embodiments the first diamond layer can be temporarily bonded to a substrate 814/914 to provide the structure sufficient mechanical strength to handle fabrication of the III-nitride transistors thereon. As illustrated in FIGS. 8 and 9, the substrate can be is bonded to the first diamond layer by means of a thermally conductive bonding layer 815/915. Substrate 814 shown in FIG. 8 can be in the form of a composite substrate formed from any one or more of diamond, silicon carbide, polysilicon carbide, graphite, copper, metal, beryllium oxide, metal-diamond composite, group III-element nitrides, silicon or polysilicon, while substrate 914 shown in FIG. 9 can be in the form of a temporary carrier substrate. In both embodiments, thermally conductive bonding layer 815/915 can be formed from any suitable material such as CMP polysilicon known in the art. Once the transistors are fabricated, carrier substrate 814/914 and bonding layer 815/915 can optionally be removed prior to the device being packaged.

Figure 10:
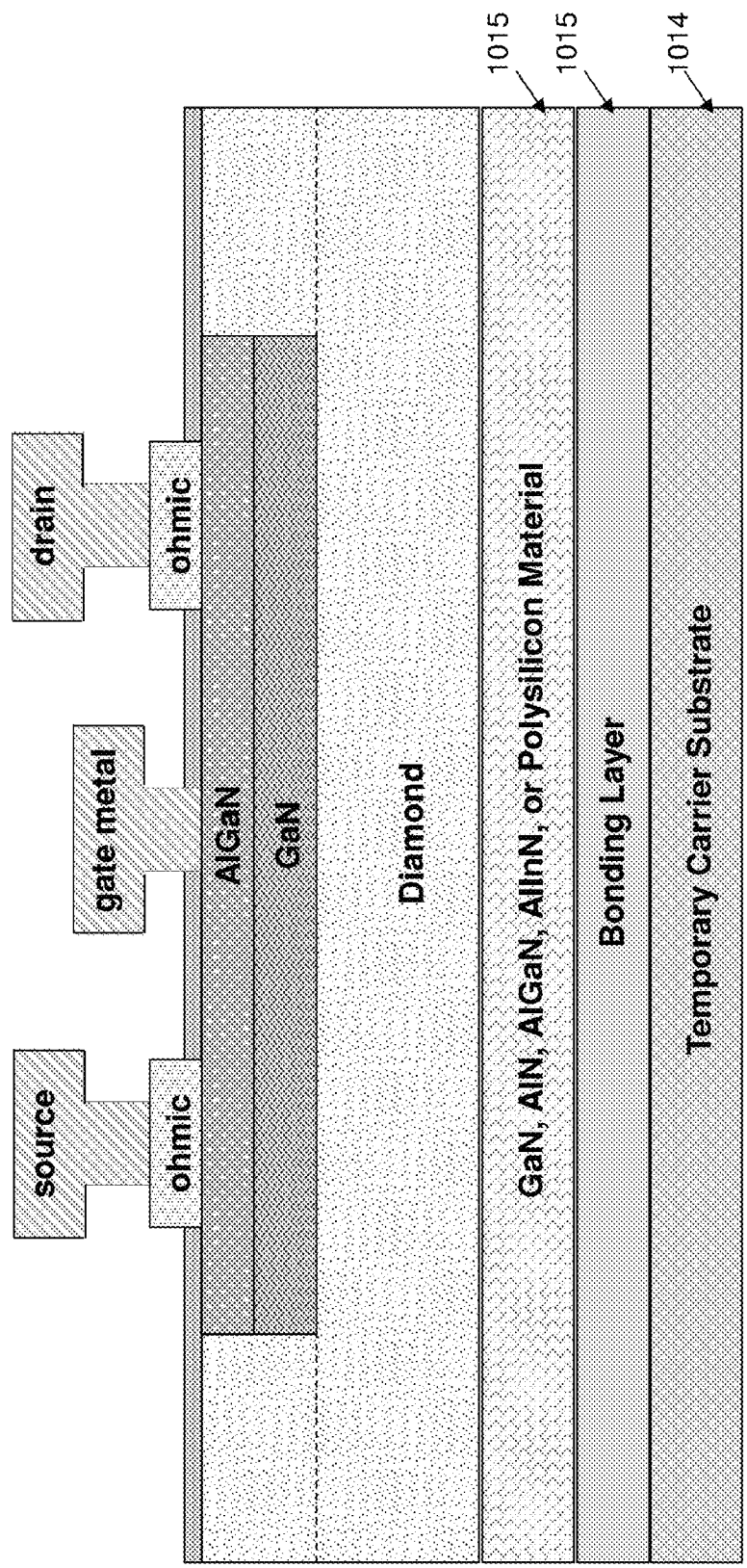
FIG. 10 is a block diagram illustrating aspects of a semiconductor structure integrated within a diamond material layer in accordance with one or more other embodiments of the present invention.

FIG. 10 illustrates aspects of another embodiment of a semiconductor structure integrated with diamond in accordance with the present invention. The embodiment illustrated in FIG. 10 is similar to the embodiment illustrated in FIG. 9, except that in the embodiment illustrated in FIG. 10, a III-nitride material layer 1016 is grown/deposited on the second side of the diamond material layer so that bonding layer 1015 bonds the temporary carrier substrate 1014 to the III-nitride material layer 1016 rather than directly to the diamond material layer.

Figure 11A:
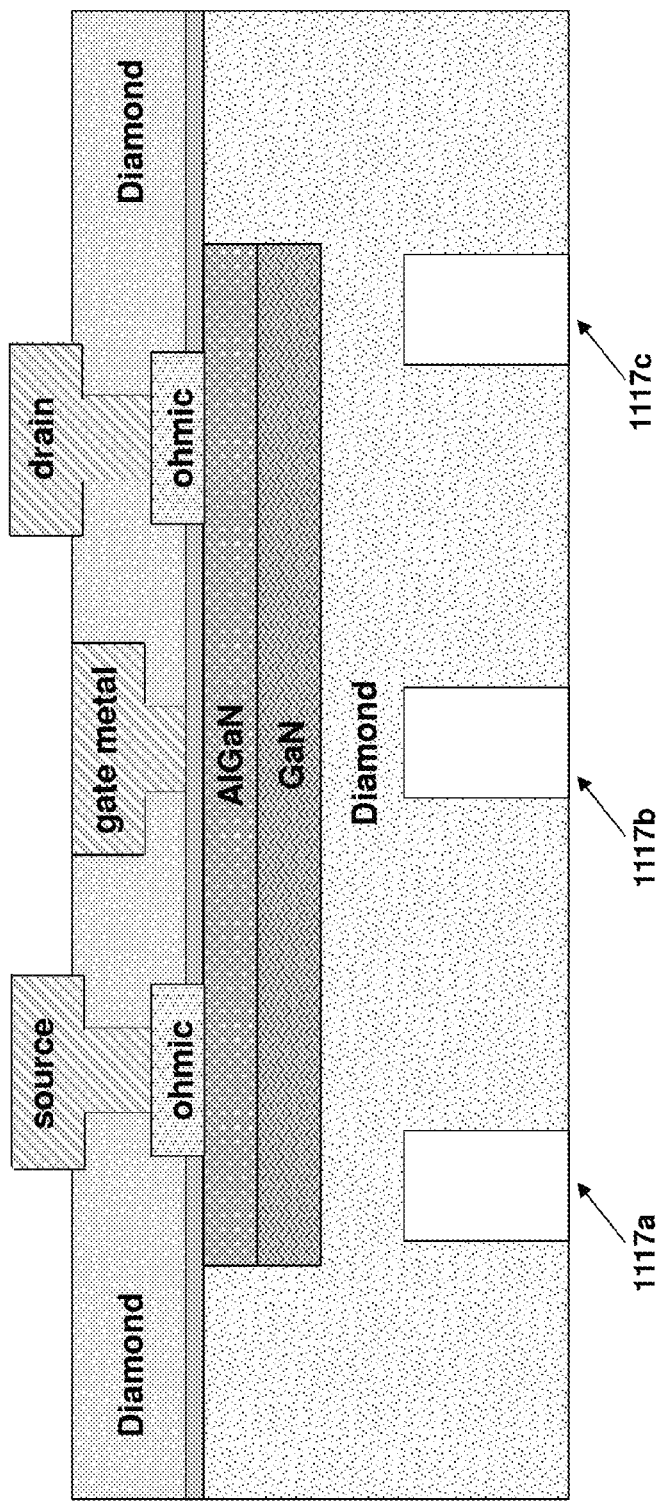
FIGS. 11A and 11B are block diagrams illustrating aspects of a semiconductor structure integrated within a diamond material layer in accordance with one or more other embodiments of the present invention.
Figure 11B:
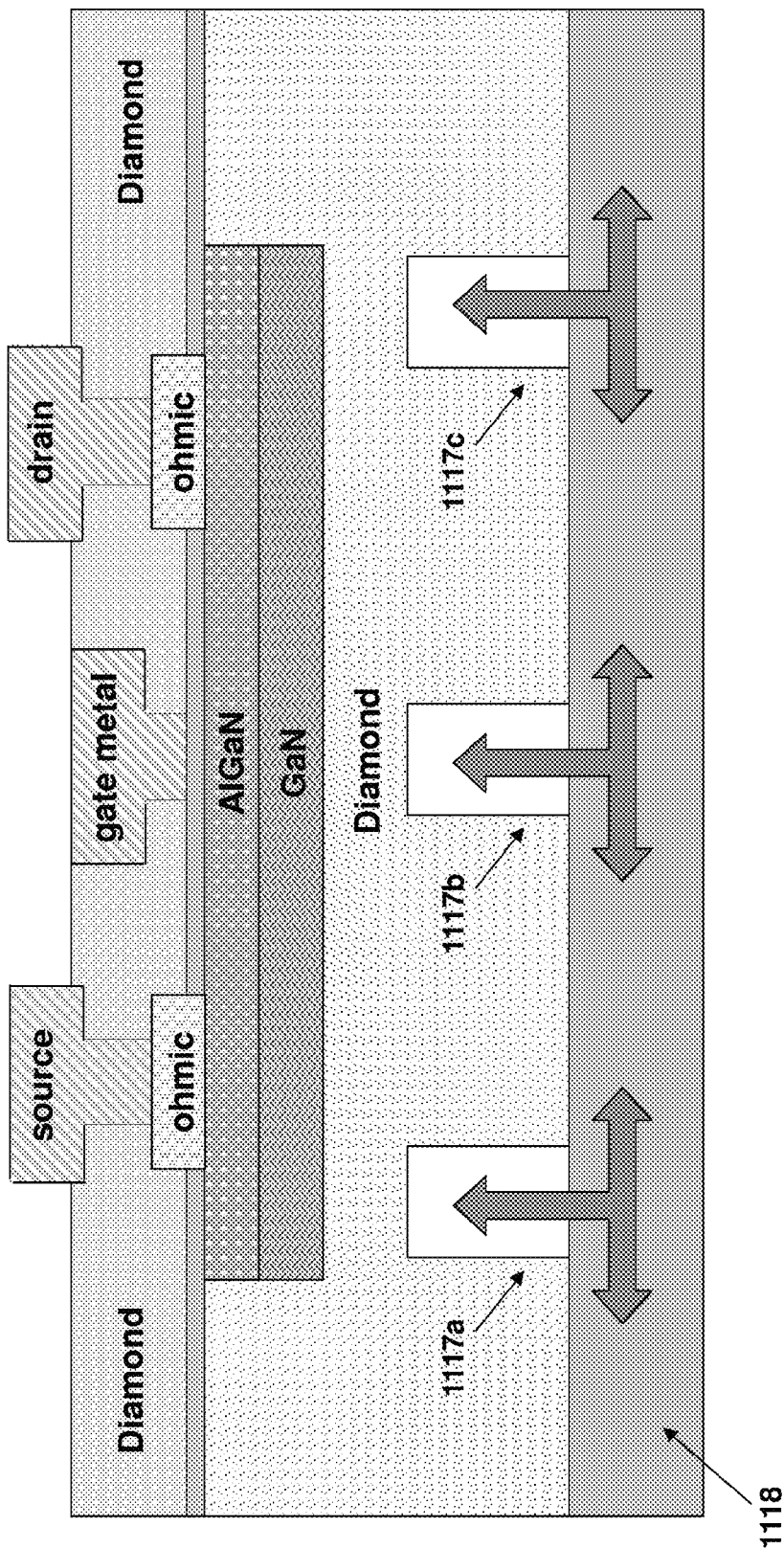

FIGS. 11A and 11B illustrate aspects of another embodiment of a semiconductor structure integrated with diamond in accordance with the present invention. In the embodiment illustrated in FIGS. 11A and 11B, one or more channels 1117a/1117b/1117c can be etched into the first diamond material layer to form a path for forced air or forced liquid from an air/liquid source 1118 shown in FIG. 11B that can provide cooling to the III-nitride HEMT device formed on the first side of the semiconductor material layers.

Figure 12A:
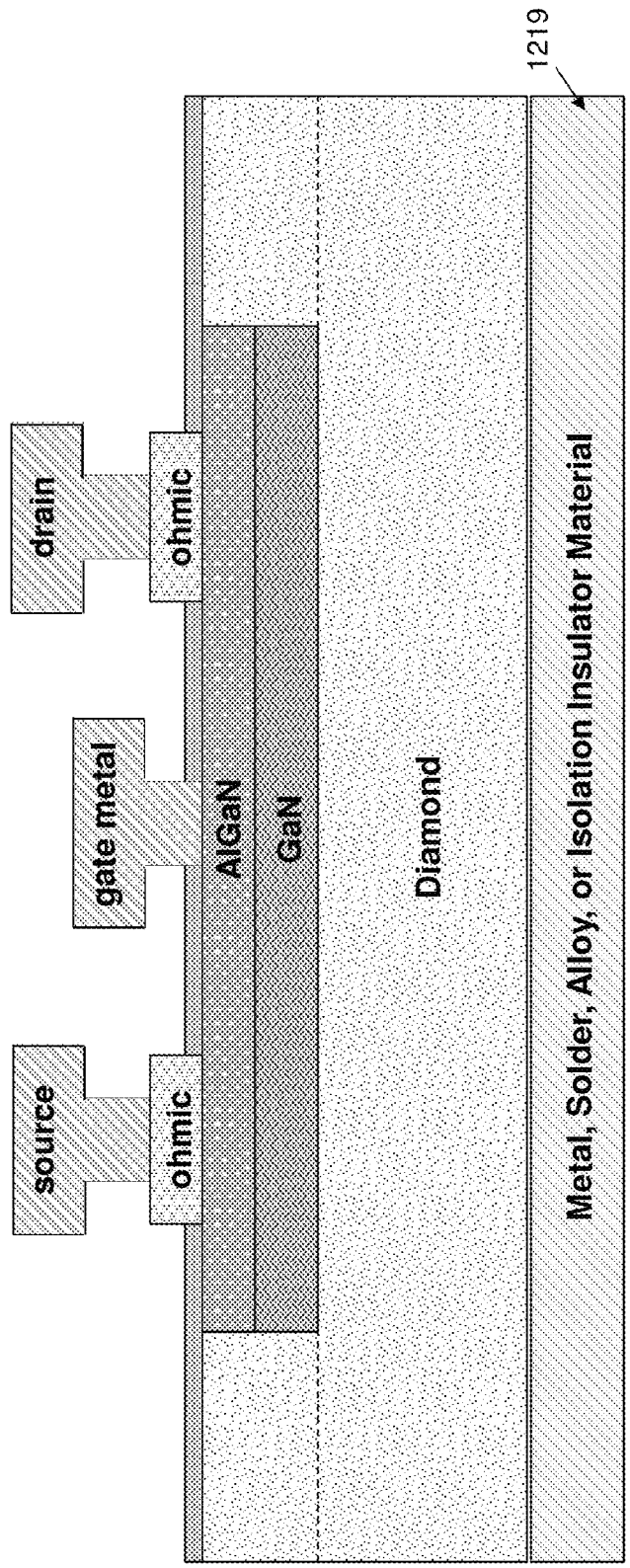
FIGS. 12A and 12B are block diagrams illustrating aspects of a semiconductor structure integrated within a diamond material layer in accordance with one or more other embodiments of the present invention.
Figure 12B:
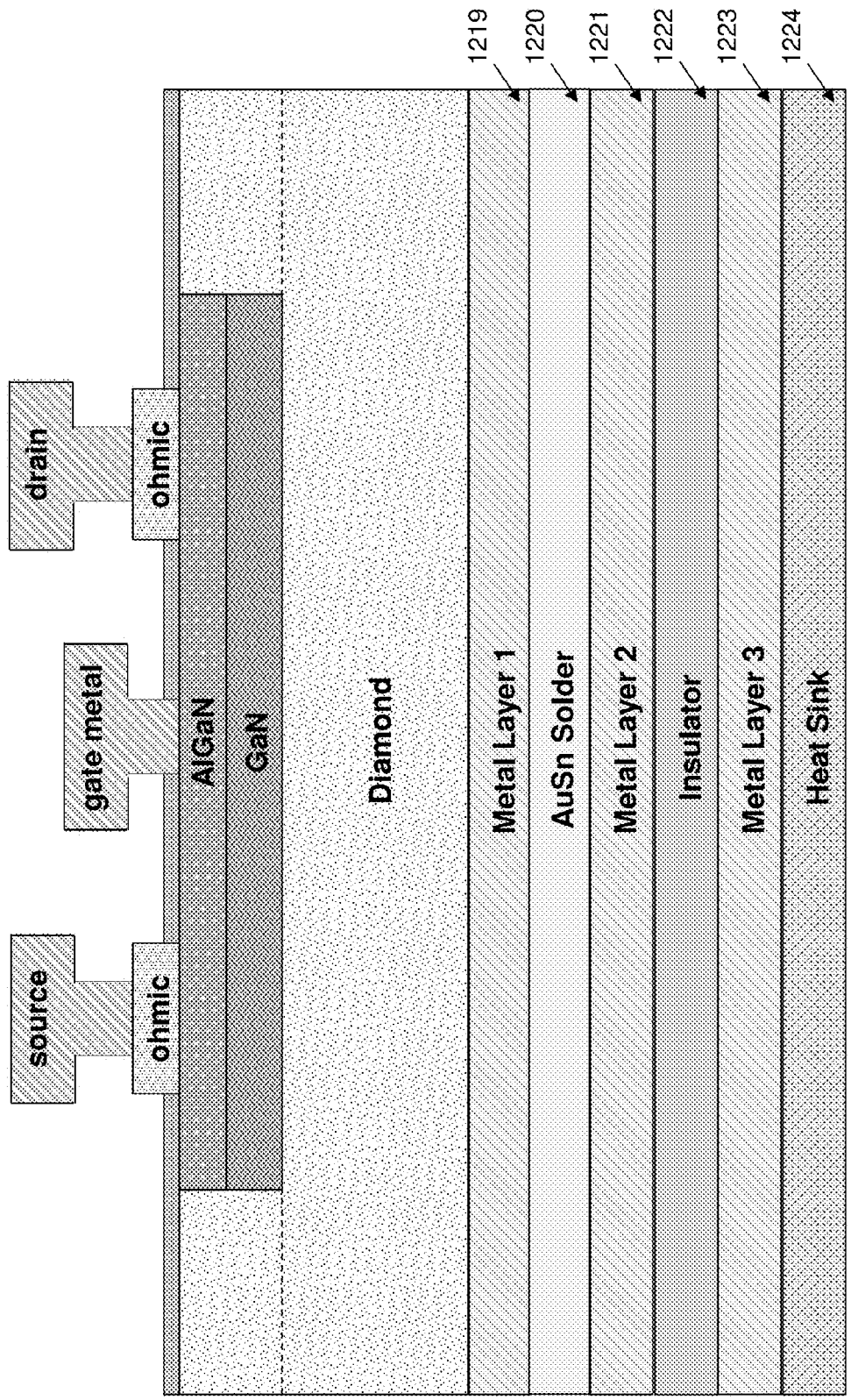

FIGS. 12A and 12B illustrate aspects of another embodiment of a semiconductor structure integrated with diamond in accordance with the present invention. In the embodiment illustrated in FIGS. 12A and 12B, the semiconductor structure is configured to be attached to a heat sink such as heat sink 1224 shown in FIG. 12B. Thus, as shown in FIG. 12A, a layer 1219 of metal, solder, alloy, or isolation insulator can be deposited on a second side of the diamond material layer to configure the semiconductor structure to a heat sink. As illustrated in FIG. 12B, in addition to metal, etc. material layer 1219, multiple additional layers can be deposited between the diamond material layer and the heat sink, including second metal material layer (Metal Layer 2) 1221 secured to the first metal material layer (Metal Layer 1) by, e.g., AuSn solder layer 1220, and a third metal material layer (Metal Layer 3) 1223 separated from Metal Layer 2 by an insulator layer 1222.

As will now be described, the present invention also includes methods for fabricating a semiconductor structure integrated with diamond, in which the structure can include a III-nitride semiconductor material having one or more III-nitride semiconductor material layers on a substrate such as a silicon, silicon carbide, or sapphire substrate, with the second side of the III-nitride semiconductor material being in contact with the substrate. The III-nitride material may consist of one or more than one III-nitride material layers formed on the substrate, such as a III-nitride nucleation layer, stacked III-nitride material layer, strain relief (strain reducing) stacked III-nitride material layers, a barrier material layer, a cap layer, or other III-nitride material layers known to those skilled in the art. In some embodiments, a completely or partially fabricated device may be formed on or within the first side of the III-nitride material, while no device may be present in other embodiments. For example, as described in more detail below, an ohmic contact and/or mesa etch may be formed in the III-nitride material on the first side prior to deposition of a first diamond layer.

A first exemplary method for fabricating a semiconductor device integrated with diamond in accordance with the present invention will now be described with reference to FIGS. 13A-13I, which illustrate aspects of such a first exemplary method.

As illustrated in FIG. 13A, in a first step in accordance with the present invention, an interface material such as interface material layer 1303 is deposited on a first side of the III-nitride material which may comprise one or more layers 1305/1306 such as AlGaN layer 1305 and/or GaN layer 1306 deposited on nucleation layer 1308 situated on substrate 1309. A passivating SiN layer 1304 can optionally be deposited on AlGaN layer 1305, either at this stage in the fabrication or later, as described below. The one or more III-nitride strain relief layers 1307 can optionally be formed between a III-nitride material layer and the nucleation layer to reduce the strain in the III-nitride material layer grown on substrates having a large thermal expansion mismatch, such as a silicon substrate. The interface material layer 1303 may optionally be polished by means of a chemical mechanical polish (CMP) or be annealed to reflow and thus smooth its surface and reduce its surface roughness sufficiently so that a handle substrate can be wafer bonded to the surface of the interface material layer 1303.

The process of wafer bonding can preferably be wafer direct bonding, also sometimes known as wafer fusion bonding. Fusion or direct bonding directly bonds two wafers that are initially only connected by the weak atomic forces (van der Waals forces) of hydroxyl (OH) groups in the interface (borderline) layer between the two wafers. By subsequently applying heat, covalent bonds are formed between the two wafers. This is a very strong, non-soluble bonding of the two wafers and is suitable for high temperature processing of the wafer pair. The surface of wafers will typically be prepared to be hydrophilic for direct or fusion bonding, especially if the wafers have a dielectric or oxide layer on the surface. It is necessary that the wafer bonding approach be suitable for the diamond growth temperature which is typically greater than 700 C. Wafer direct bonding or fusion bonding is suitable for the wafer pair being exposed to the diamond growth temperature. A surface roughness of less than approximately 1 nm is desirable for the surface of interface material layer 1303 to facilitate the wafer direct bonding of handle substrate 1301 to the surface of the interface material layer, so that if the process for depositing the interface material layer is such that the surface of the interface material layer has a low surface roughness, then a CMP polish is not required.

Interface material layer 1303 typically is a PECVD silicon oxide layer, a PECVD deposited silicon nitride layer, a PECVD silicon layer, or a LPCVD polysilicon layer, but any other suitable material can be used by those skilled in the art, so long as the material is compatible with temperatures needed for deposition of a diamond material layer. The typical diamond material layer deposition temperature is higher than about 700° C. and more typically higher than 1000° C.

In addition to having the temperature capability for deposition of the diamond material layer, it is also desirable that interface material layer 1303 be selected so that its coefficient of thermal expansion is not too different than the coefficient of thermal expansion of the III-nitride layer(s) 1305/1306 and handle substrate 1301. If a device is partially or completely formed on the first side of the III-nitride material layer 1305, a thicker interface material layer having a thickness of approximately 1 μm or thicker may selected to so that when the CMP polish is performed, some portion of interface material layer 1303 can be removed during the polishing step to achieve a desired low surface roughness, but the material layer(s) 1305/1306 of the structure are not affected. If there are etched structures in the III-nitride layers 1305/1306, such as etching of the III-nitride layers to isolate different III-nitride regions, then the CMP polish can also be used to planarize the surface of interface material layer 1303 in addition to achieving a low surface roughness to facilitate the wafer direct bond of the handle substrate 1301 to the surface of the interface material layer 1303.

It is desirable that handle substrate 1301 not be etched during the process steps to remove substrate 1309. In addition, in this first step, a etch protection material layer 1302 can optionally be deposited or grown on the handle substrate 1301. The etch protection material layer can be desirable to prevent the etching of the handle substrate 1301 if a etch process is used to remove substrate 1309. Etch protection material layer 1302 can comprise a silicon oxide, silicon nitride, silicon carbide, $Al_2O_3$, HfO2, spin-on glass, or any other suitable material, so long as the material used is compatible with the deposition temperature for the diamond material layer, i.e., temperatures greater than 700° C. and more typically higher than 1000° C. The surface of the etch protection material layer 1302 can be CMP polished to reduce the surface roughness to facilitate the bonding of the handle substrate 1301 to interface material layer 1303.

Handle substrate 1301 should be selected to be compatible with the technique used for removal of the substrate 1309. For example, if a $HNO_3$-based chemical etch process or a combination of a grinding and a $HNO_3$-based chemical etch is used to remove the silicon substrate 1309, a handle substrate such as quartz or other material that is not etched by the chemical etch process may be preferred.

In other cases, a handle substrate that comprises a silicon substrate with a etch protection material layer 1302 of silicon oxide, silicon nitride, silicon carbide, $Al_2O_3$, HfO2, spin-on glass, or other protective material layers deposited by CVD, ALD, PECVD, etc. that are etch-resistant $HNO_3$ etch or plasma etch can be used to protect the handle substrate from being etched. To achieve direct or fusion bonding to the interface material layer 1301 the etch protection material layer should have surface roughness of less than 1 nm. The etch protection material layer 1302 can be CMP polished to achieve low surface roughness. The spin chemical spray technique such as is used in the DISCO substrate removal process known in the art can also be used to remove the silicon substrate without significantly etching the handle substrate 1301.

The material used for handle substrate 1301 should also be selected to be temperature-compatible with the diamond deposition temperature and also should be selected for a coefficient of thermal expansion that is compatible substrate 1309 having III-nitride material layers for the diamond deposition processing temperature.

The thickness of handle substrate 1301 should also be selected to minimize the wafer bowing that results because of the difference in the thermal expansion coefficient of the handle substrate 1301 and the diamond material layer. For the case of a silicon handle substrate, a handle substrate thickness of 1 mm or greater (for example, 3 mm) can be selected to minimize bowing for thick diamond material layer deposition.

Handle substrate 1301 is bonded to the interface material layer 1303, with handle substrate 1301 having an optional etch protection material layer 1302 or, if the surface roughness of the interface material layer is less than approximately 1 nm thick, directly to interface material layer 1303. Bonding can be facilitated by any appropriate means known in the art, with techniques such as plasma activation, hydrophilic surface preparation, application of pressure during bonding, application of vacuum during bonding, being optionally used to improve the wafer bonding process.

In a next step, aspects of which are illustrated in FIG. 13B, substrate layer 1309 is removed from the second side of III-nitride material layer(s) 1305/1306. The process of removing the substrate layer 1309 can be accomplished using any suitable technique known in the art, such as chemical etching, plasma etching, grinding, polishing, disco etching, laser ablation of material at the semiconductor material/substrate interface to weaken a bond and allow the substrate to be separated from the semiconductor material, or any combination thereof. In the case where substrate layer 1309 is a sapphire substrate, laser ablation can also optionally be used to ablate the interface of the substrate and the III-nitride material layer(s) 1305/1306.

In a next step, illustrated in FIG. 13C, III-nitride nucleation layer 1307 and optional one or more III-nitride strain relief layers 1308 are removed to expose the second side, i.e., the side originally closest to the substrate, of III-nitride material layer(s) 1305/1306. Removal can be by means of any suitable process known in the art, such as plasma etch, ion milling, or photoelectrochemistry. The advantage of removing III-nitride nucleation layer 1307 and/or strain relief (strain reducing) stacked III-nitride layer(s) 1308 is that these layers, if present near the second side of the semiconductor material, can increase the thermal resistance between the first diamond material layer and the first side of the semiconductor material, where a device will be fabricated. The removal of one or more III-nitride nucleation layer and/or a portion of the III-nitride material can reduce the thermal boundary resistance for heat that is generated by a device formed in or on the semiconductor material to the first diamond material layer.

In some cases, it can be desirable to design III-nitride material layer(s) 1305/1306 so that at the completion of the etch process, there is a thin AlGaN or AlN hydrogen etch protection material layer on the second surface of the III-nitride material layer to act as a protective layer for the subsequent diamond material layer deposition so that the hydrogen plasma does not significantly etch the III-nitride material layer. For example, the III-nitride epitaxial layer stack can be designed to incorporate an etch stop layer that would allow GaN to be etched and then stop at an hydrogen etch protection layer AlGaN or AlN layer using processes that are known to those skilled in the art.

In addition, because a gas ambient (hydrogen plasma) used in growing first diamond material layer can etch GaN, in some cases it can be desirable to have an AlN or AlGaN hydrogen etch protection layer on the exposed second side of the semiconductor material that is resistant to being etched by the gas ambient in the first diamond material growth system ambient. Selective plasma or etches that etch GaN material and stop at an AlN or GaN surface can be desirable in having an AlN or AlGaN material layer on the exposed second side of the semiconductor material.

An optional deposited hydrogen etch protection material layer can also be deposited on the second side of the III-nitride semiconductor material structure prior to the deposition of the optional diamond nucleation layer or the growth of the first diamond material layer. The deposited hydrogen etch protection layer will typically be AlGaN, AlN, Al2O3, metal oxide, or silicon nitride, or other material layers known to those skilled in the art.

It is desirable that the deposited hydrogen etch protection layer have a few number of pin holes that would allow hydrogen plasma gas to penetrate through the hydrogen etch protection layer and etch GaN material.

For the case that hydrogen etch protection material layer is grown on the second side of the semiconductor material, approaches to grow the hydrogen etch protection material can include, not limited to, atomic layer epitaxy, atomic layer deposition, metal organic chemical vapor deposition, atomic layer deposition, plasma enhanced chemical vapor deposition, or other deposition approaches known to those skilled in the art. It is preferred that the deposited hydrogen etch protection material be substantially single-crystal material to provide a lower thermal impedance material layer, however, the deposited hydrogen etch protection layer can also be highly oriented, amorphous, or other material forms known to those skilled in the art. The thickness of the deposited hydrogen etch protection layer is sufficient to prevent the etching of GaN material by the hydrogen plasma etch and can have a thickness of approximately 1 nm to 20 nm or larger.

The thermal resistance of the deposited hydrogen etch protection layer is typically proportional to the thickness of the deposited hydrogen etch protection layer and will be reduced for thinner layers.

In addition, in some embodiments, native oxide on the surface of the semiconductor material can be removed. The native oxide on the surface of the semiconductor material can also be removed in situ by a hydrogen etch prior to the process of growing the diamond material layer.

As illustrated in FIG. 13D, in a next step, III-nitride material layer(s) 1305/1306 can optionally be etched in one or more selected regions 1310a/1310b, entirely or approximately to the first side of III-nitride material layer(s) 1305/1306 or approximately to the first side of the III-nitride material layer, to the interface of interface material layer 1303 and the first side of the III-nitride material. To perform this etch, a material such as PECVD oxide layer or a metal layer can be deposited on the second side of the III-nitride material to act as a plasma etch mask material, with the selected regions to be etched being defined by photolithography. The plasma etch mask material can be etched to the second side of the III-nitride material and then the III-nitride material layer is etched. The design of the photolithograph mask can be such that most of the area of the III-nitride material layer will be etched forming mesa isolation regions 1310a/1310b, with a plurality of small areas 1320a/1320b/1320c of III-nitride material will remain that are attached (bonded) to the interface material and the handle substrate.

In the next step, aspects of which are illustrated in FIG. 13E, a first diamond material layer 1311 is then deposited on the second side of the III-nitride material layer to cover the areas 1320a/1320b/1320c of III-nitride material, the diamond material also filling mesa isolation regions 1310a/1310b.

The advantage of having the small areas of III-nitride material 1320a/1320b/1320c is that the thermal expansion coefficient of diamond is significantly different (a lower value) than the thermal coefficient expansion of the III-nitride material, and the smaller the lateral dimensions of the areas of III-nitride material having a direct interface with the diamond, the lower the resulting compressive strain within the III-nitride material. In addition, having such a small lateral dimension of the III-nitride material layers interfacing with the diamond material results in reduced lateral thermal resistance for the deposition of a second diamond material layer if such a second layer is desired.

In some embodiments (see, e.g., the embodiment illustrated in FIG. 13G described below), the lateral dimensions of the III-nitride material can be selected so that the active region of the device is formed entirely within the surface area the III-nitride material.

In other embodiments, the lateral dimension of the III-nitride material can be selected so that a portion of the device is formed within the dimensions of the surface area of the III-nitride material, e.g., where a portion of the gate (the gate extension) overlap onto the region outside of the III-nitride material and onto one of the mesa isolation regions filled with the first diamond material layer.

In other embodiments, a portion of the ohmic contact and/or gate extension overlap onto the region outside of the III-nitride material and onto one of the mesa isolation regions filled with first diamond material layer.

The strain impressed on the semiconductor material by the diamond material will be a compressive strain. In addition, the approach of etching the III-nitride material layer to the III-nitride material layer first side prior to first diamond material layer deposition will provide diamond on the second side of the III-nitride material layer and also the side surfaces of the III-nitride material layer and will enable direct contact of the first diamond material layer to the second diamond material layer.

First diamond material layer 1311 can be grown or deposited on the plurality of regions 1320a/1320b/1320c on the second side of the III-nitride material and in the etched regions 1310a/1310b using any suitable technique known in the art. One such technique is Bias Enhanced Nucleation. Another such technique is a diamond CVD procedure, which first grows diamond on the III-nitride at a slow rate to achieve high thermal conductivity near the interface of the with the III-nitride material. In other procedures, diamond material layer 1311 can be grown so that it grows with columnar grains oriented perpendicular to the second side of the III-nitride material, which improves the diamond thermal conductivity in the direction perpendicular to the second side of the III-nitride material.

In some embodiments, diamond material layer 1311 can have a thickness that is compatible with it being a substrate, while in other embodiments, diamond material layer 1311 can have a thickness compatible with it being a material layer in a diamond composite substrate.

The key requirements for the first diamond material layer to behave as a substrate is to have sufficient thickness for sufficient mechanical strength for handling without breakage. A typical thickness for a first diamond material layer as a substrate is approximately a thickness of 150 μm, though other thicknesses may also be suitable depending on the diameter of the substrate and the handling requirements. It is also important that the strain in the first diamond material layer be optimized to prevent breakage of the substrate. The diamond material layer thickness for use as a substrate should be selected so that it is compatible with the diamond material layer being free-standing after the handle substrate is removed.

A diamond material layer that is compatible with being a material layer in a diamond composite substrate can have a thickness of, e.g., 20, 50, 100, or 150 μm. The diamond composite substrate may comprise a second deposited material such as a thick AlN, thick AlGaN, thick GaN or thick polysilicon layer deposited on the second surface of first diamond material layer 1311. The AlN, AlGaN, or GaN layers can be deposited by HVPE or MOCVD techniques while the polysilicon layers will be typically deposited by CVD. In some embodiments, the diamond composite substrate can comprise a diamond material layer having a thickness of e.g., about 20, 50, or 100 μm, bonded to a carrier substrate such as a silicon, sapphire or quartz substrate, with the bonding being a polymer, spin-on glass, or graphite.

For III-nitride devices that incorporate transmission lines on their substrate, a preferred thickness of the semi-insulating or insulating substrate is about 50 to about 100 μm, and the composite substrate can be in the form of a diamond material layer alone or can comprise a diamond material layer with AlN, AlGaN, GaN, or polysilicon layer bonded to a carrier substrate, with the carrier substrate being remove at the end of the process to have a composite substrate of the preferred thickness for microwave transmission line or thermal conductance considerations.

In a next step of a process for fabricating a semiconductor device with diamond in accordance with the present invention, aspects of which are illustrated in FIG. 13F, handle substrate 1301 and etch protection material layer 1302 are removed from the first side of semiconductor material layers 1305/1306, as is the interface material layer 1303, if present.

Thus, using the steps described above, a semiconductor material integrated with a diamond material layer can be prepared.

In some embodiments, additional III-nitride epitaxial material layers are deposited on the first side of the III-nitride semiconductor material to fabricate a semiconductor device. In such a case, the surface of III-nitride material layer(s) 1305/1306 should be suitably prepared for the III-nitride epitaxial material layer growth. The surface then is cleaned, and material layers are deposited to form a device such as the device illustrated in FIG. 13G, using the following typical process steps:

Form ohmic contacts 1315a/1315b;
Form Schottky gate 1313;
Form contacts for source 1312 and drain 1313;
Deposit a passivating SiN surface layer 1304 if not previously deposited;
Etch contact windows to the ohmic contacts 1315a/1315b and gate 1313; and
Deposit a thick metal layer for interconnect (not shown).
Optionally deposit a protecting film (not shown) to protect the III-nitride semiconductor material from the gases and plasma in the ambient and ion energy in the ambient for depositing Second Diamond material;
Perform a nucleation step which can consist of depositing a nanocrystalline diamond material or a bias enhanced nucleation;
Optionally deposit a second diamond material layer 1316, either before the gate or after the gate as described in patent in U.S. Pat. No. 8,039,301 "Gate after Diamond Transistor," supra.

If the optional mesa isolation region is etched to the front side (first side) of the III-nitride material, second diamond material layer 1316 should be deposited and defined that there is direct contact between first diamond material layer 1311 and second diamond material layer 1316 for reduced thermal impedance from the device channel region to the first diamond material layer second surface/heat sink.

Figure 13I:
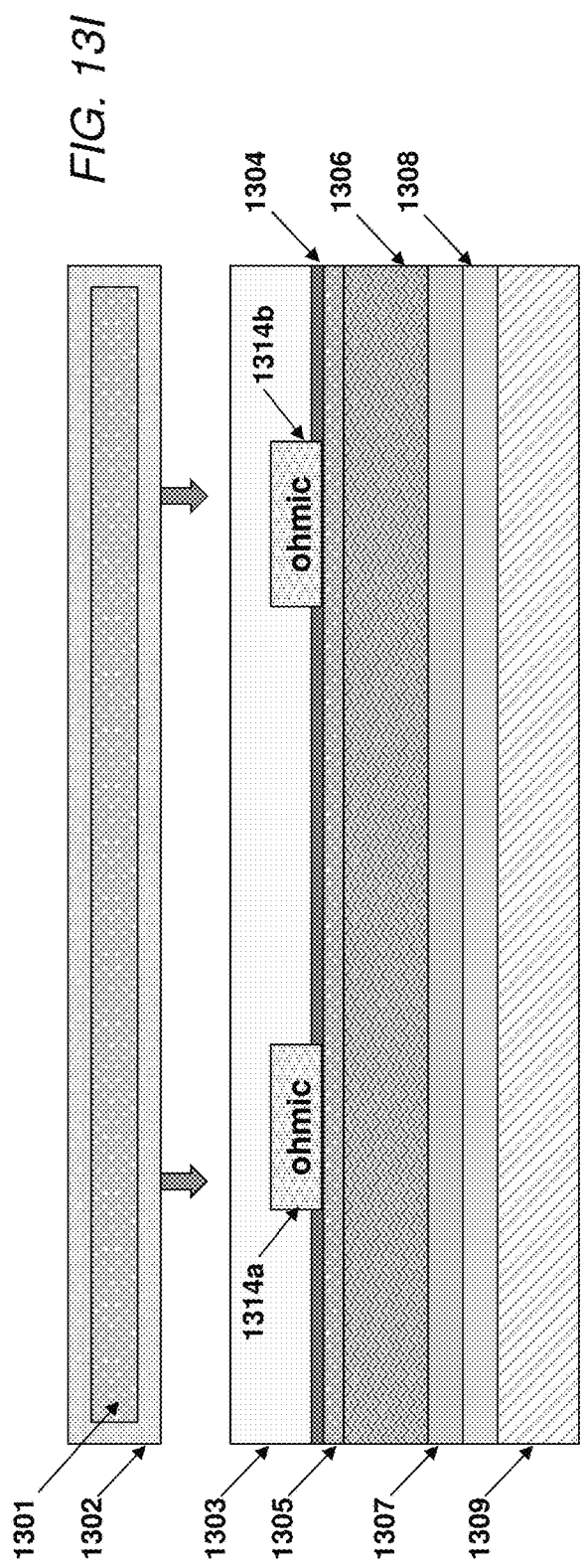

In an alternative embodiment, illustrated in FIG. 13I, ohmic contacts 1315a/1315b can be formed on the surface of the semiconductor material layer(s) 1305/1306 before removal of substrate layers 1307/1308/1309 and before the bonding of handle substrate 1301 and optional bonding layer 1302 to the semiconductor material layers.

FIGS. 14A-14H illustrate aspects of another method for fabricating a semiconductor device integrated with diamond in accordance with the present invention.

As illustrated in FIG. 14A, as with the first exemplary method described above, in a first step of a second method for fabricating a semiconductor device integrated with diamond in accordance with the present invention, an interface material such as interface material layer 1403 is deposited on a first side of the III-nitride material which may comprise one or more layers 1405/1406 such as AlGaN layer 1405 and/or GaN layer 1406 grown on nucleation layer 1408 situated on substrate 1409. A passivating SiN layer 1404 can optionally be deposited on AlGaN layer 1405, either at this stage in the fabrication or later, as described below. The one or more III-nitride strain relief layer 1407 can optionally be formed between a III-nitride material layer and the nucleation layer to reduce the strain in the III-nitride material layer grown on substrates having a large thermal expansion mismatch, such as a silicon substrate.

The interface material layer 1403 may optionally be polished by means of a chemical mechanical polish (CMP) or be annealed to reflow and thus smooth its surface and reduce its surface roughness sufficiently so that a handle substrate 1401 can be wafer bonded to the surface of the interface material layer 1403. A surface roughness of less than approximately 1 nm is desirable for the surface of interface material layer 1403 to facilitate the wafer bonding of handle substrate 1401 to the surface of the interface material layer, so that if the process for depositing the interface material layer is such that the surface of the interface material layer has a low surface roughness, then a CMP polish is not required.

Interface material layer 1403 typically is a PECVD silicon oxide layer, a PECVD deposited silicon nitride layer, a PECVD silicon layer, or a LPCVD polysilicon layer, but any other suitable material can be used by those skilled in the art, so long as the material is compatible with temperatures needed for deposition of a diamond material layer. The typical diamond material layer deposition temperature is higher than about 700° C. and more typically higher than 1000° C.

In addition to having the temperature capability for deposition of the diamond material layer, it is also desirable that interface material layer 1403 be selected so that its coefficient of thermal expansion is not too different than the coefficient of thermal expansion of the III-nitride layer(s) 1405/1406 and handle substrate 1401. If a device is partially or completely formed on the first side of the III-nitride material layer 1405, a thicker interface material layer having a thickness of approximately 1 μm may selected to so that when the CMP polish is performed, some portion of interface material layer 1403 can be removed during the polishing step to achieve a desired low surface roughness, but the material layer(s) 1405/1406 of the structure are not affected.

It is desirable that handle substrate 1401 not be etched during the process steps to remove substrate 1409. In addition, in this first step, a etch protection material layer 1302 can optionally be deposited or grown on the handle substrate 1401. The etch protection material layer can be desirable to prevent the etching of the handle substrate 1401 if a etch process is used to remove substrate 1409. Etch protection material layer 1402 can comprise a silicon oxide, silicon nitride, silicon carbide, $Al_2O_3$, HfO2, spin-on glass, or any other suitable material, so long as the material used is compatible with the deposition temperature for the diamond material layer, i.e., temperatures greater than 700° C. and more typically higher than 1000° C. The surface of the etch protection material layer 1302 can be CMP polished to reduce the surface roughness to facilitate the bonding of the handle substrate 1401 to interface material layer 1403.

Handle substrate 1401 should be selected to be compatible with the technique used for removal of the substrate 1409. For example, if a $HNO_3$-based chemical etch process or a combination of a grinding and a $HNO_3$-based chemical etch is used to remove the silicon substrate 1409, a handle substrate such as quartz or other material that is not etched by the chemical etch process may be preferred.

In other cases, a handle substrate that comprises a silicon substrate with a etch protection material layer 1402 of silicon oxide, silicon nitride, silicon carbide, $Al_2O_3$, HfO2, spin-on glass, or other protective material layers deposited by CVD, ALD, PECVD, etc. that are etch-resistant $HNO_3$ etch or plasma etch can be used to protect the handle substrate from being etched. To achieve direct or fusion bonding to the interface material layer 1401 the etch protection material layer should have surface roughness of less than 1 nm. The etch protection material layer 1302 can be CMP polished to achieve low surface roughness. The spin chemical spray technique such as is used in the DISCO substrate removal process known in the art can also be used to remove the silicon substrate without significantly etching the handle substrate 1401.

The material used for handle substrate 1401 should also be selected to be temperature-compatible with the diamond deposition temperature and also should be selected for a coefficient of thermal expansion that is compatible substrate 1409 having III-nitride material layers for the diamond deposition processing temperature.

The thickness of handle substrate 1401 should also be selected to minimize the wafer bowing that results because of the difference in the thermal expansion coefficient of the handle substrate 1401 and the diamond material layer. For the case of a silicon handle substrate, a handle substrate thickness of 1 mm or greater (for example, 3 mm) can be selected to minimize bowing for thick diamond material layer deposition.

Handle substrate 1401 should be selected to be compatible with the technique used for removal of the silicon or sapphire substrate. For example, if a $HNO_3$-based chemical etch process or a combination of a grinding and a $HNO_3$-based chemical etch is used to remove the silicon substrate, a quartz handle substrate material may be preferred.

In other cases, a handle substrate that comprises a silicon substrate with a protective coating of silicon oxide, silicon nitride, silicon carbide, $Al_2O_3$, or other protective material layers deposited by CVD, ALD, PECVD, etc. that are etch-resistant $HNO_3$ etch or plasma etch can be used. The spin chemical spray technique such as is used in the DISCO substrate removal process known in the art can also be used to remove the silicon substrate without significantly degrading the handle substrate.

The material used for handle substrate 1401 should also be selected to be temperature-compatible with the diamond deposition temperature and also should be selected for a coefficient of thermal expansion that is compatible with diamond deposition temperature. The thickness of handle substrate 1401 should also be selected to minimize the wafer bowing that results because of the difference in the thermal expansion coefficient of the handle substrate and the diamond material layer. For the case of a silicon handle substrate, a handle substrate thickness of 1 mm or greater (for example, 3 mm) can be selected to minimize bowing for thick diamond material layer deposition.

Handle substrate 1401 is bonded to the interface material layer 1403, with handle substrate 1401 being bonded by means of bonding material layer 1402 or, if the surface of the interface material layer is less than approximately 1 nm thick, directly to interface material layer 1403. Bonding can be achieved by any appropriate means known in the art, with techniques such as plasma activation, hydrophilic surface preparation, application of bonding press, application of vacuum, being optionally used to improve the wafer bonding process.

In a second step, illustrated in FIG. 14B, a trench 1410 can be etched in silicon or silicon carbide substrate 1409 from the second side of the substrate to the III-nitride nucleation layer 1408. Etching can be done using any suitable process such as chemical etching, plasma etching, photoelectrochemical etching, or porous etching. The lateral dimension of trench 1410 can be selected so that the active region of the semiconductor device is formed within its lateral dimension. Alternatively, the lateral dimension of trench 1410 can be selected so that only a portion of the device is formed within the surface area of the trench. For example, in one embodiment, a portion of the gate (the gate extension) overlaps onto the region outside the trench material (e.g., mesa isolation regions filled with the first diamond material layer, as illustrated in FIG. 3). In an alternative embodiment, a portion of the ohmic contact and/or gate extension can overlap onto the region outside of the trench. In an embodiment in which the III-nitride material region is encased in diamond, it is desirable to have the trench lateral dimension to extend beyond the ohmic contact and top side III-nitride mesa etch; in such a case, when a second diamond material layer is deposited on the device (either before the gate or after the gate), the second diamond material layer can extend outside of the mesa edge and thus make direct contract between the second diamond material layer and the first diamond material layer.

In a next step, aspects of which are illustrated in FIG. 14C, nucleation layer 1407, optional one or more III-nitride strain relief layer 1408, and one or more III-nitride material layer(s) 1405/1406 are removed in the area defined by trench 1410. Removal can be by means of any suitable process known in the art, such as plasma etch, ion milling, or photoelectrochemistry. The advantage of removing III-nitride nucleation layer 1407 and/or strain relief (strain-reducing) stacked III-nitride layer(s) 1408 is that these layers, if present near the second side of the semiconductor material, can increase the thermal resistance between the first diamond material layer and the first side of the semiconductor material, where a device will be fabricated.

After their removal, as illustrated in FIG. 14C, the trench area is defined at the top by a III-nitride or other material layer 1406 and at each side by a structure comprising the unetched portions of one or more strain relief layer 1407, nucleation layer 1408, and substrate 1409.

In some cases, it can be desirable to design III-nitride material layer(s) 1405/1406 so that at the completion of the etch process, there is a thin AlN material on the second surface of the III-nitride material layer to act as a protective layer for the subsequent diamond material layer deposition so that the hydrogen plasma does not significantly etch the III-nitride material layer.

In addition, because a gas ambient (hydrogen plasma) used in growing first diamond material layer can etch GaN, in some cases it can be desirable to have an AlN or AlGaN layer on the exposed second side of the semiconductor material that is resistant to being etched by the gas ambient in the first diamond material growth system ambient. Selective plasma or etches that etch GaN material and stop at an AlN or GaN surface can be desirable in having an AlN or AlGaN material layer on the exposed second side of the semiconductor material.

Additional steps that optionally can be taken at this point in the fabrication process include one or more of the following:

removing native oxide on the surface of the semiconductor material. The native oxide on the surface of the semiconductor material can also be removed in situ by a hydrogen etch prior to the process of growing the diamond material layer;

depositing a thin AlN layer that protects the semiconductor material layer from being etched by the gases and plasma in the diamond material deposition process;

depositing a diamond nucleation layer on the second side of the III-nitride material and in the etched region using standard technology for depositing diamond nucleation material;

using a Bias Enhanced Nucleation approach to grow diamond on the second side of the III-nitride material and the etched region between the III-nitride materials;

using a diamond CVD deposition procedure that first grows diamond on the III-nitride at a slow rate to achieve high thermal conductivity near the interface of the with the III-nitride material; and growing the diamond so that diamond grows with columnar grains oriented perpendicular to the second side of the III-nitride material. The columnar gain will improve the diamond thermal conductivity in the direction perpendicular to the second side of the III-nitride material.

In a next step, illustrated in FIG. 14D, a first diamond material layer 1411 is deposited, preferably so that it is deposited conformally on trench 1410. The diamond material layer is initially deposited at the top of the trench, on the second side of the III-nitride material regions (e.g., III-nitride material layer 1406). The advantage of having small lateral dimension for the trench is that the thermal expansion coefficient of diamond is significantly different (a lower value) than the thermal coefficient expansion of the III-nitride material and the resulting compressive strain within the III-nitride material will be smaller the smaller the lateral dimensions of the trench. The strain impressed on the semiconductor material by the diamond material will be a compressive strain. In addition, the approach of etching the III-nitride material layer to the second side of the III-nitride material in the process of forming a mesa from the topside will enable direct contact of the first diamond material layer to the second diamond material layer. In some embodiments, the diamond material layer may be in the form of a composite layer comprising a diamond material layer with a second material such as a thick Aluminum nitride, thick AlGaN, thick GaN or thick polysilicon layer deposited on the outer surface of the diamond material layer. The AlN, AlGaN, or GaN layers can be deposited by HVPE or MOCVD techniques while the polysilicon layers will be typically deposited by CVD. Thus, the diamond material layer can consist of a diamond material layer or a diamond material layer and AlN, AlGaN, GaN, or polysilicon layer bonded to a carrier substrate, with the carrier substrate being removed at the end of the process to have a composite substrate of the preferred thickness for microwave transmission line or thermal conductance considerations.

In the next step, illustrated in FIG. 14E, handle substrate 1401 and, if present, bonding material layer 1402 are removed from the first side of semiconductor material layer(s) 1405/1406 (or, if present, interface material layer 1403).

If optionally additional III-nitride epitaxial material layers are to be formed on the first side of the III-nitride material layer, the surface then should be suitably prepared for the III-nitride epitaxial material layer growth.

In some embodiments, additional III-nitride epitaxial material layers are deposited on the first side of the III-nitride material to fabricate a semiconductor device. In such a case, the surface of III-nitride material layer(s) 1405/1406 should be suitably prepared for the III-nitride epitaxial material layer growth. The surface then is cleaned, and material layers are deposited to form a device such as the device illustrated in FIG. 14F, using the following typical process steps:

Form ohmic contacts 1415a/1415b;
Form Schottky gate 113;
Form contacts for source 1412 and drain 1413;
Deposit a passivating SiN surface layer 1304 if not previously deposited;
Etch contact windows to the ohmic contacts 1015a/1015b and gate 1013; and
Deposit a thick metal layer for interconnect (not shown).

In addition, as shown in FIG. 14G, in some embodiments, a mesa can be etched from the top (first side) of the III-nitride semiconductor material to the bottom (second side) of the III-nitride semiconductor material to expose the first side of diamond material layer 1411 if trench 1410 has been designed so that its lateral dimension extends beyond lateral dimensions of the ohmic contact metal and mesa edge.

In some embodiments, a protective film can be deposited to protect the III-nitride semiconductor material from the gases and plasma in the ambient and ion energy in the ambient for depositing Second Diamond material In some embodiments, a nucleation step which includes depositing a nanocrystalline diamond material or a bias enhanced nucleation can be performed.

In some embodiments, illustrated in FIG. 14G, a second diamond material layer 1416 can be deposited on the structure, before or after the gate, as described in U.S. Pat. No. 8,039,301 "Gate after Diamond Transistor," supra.

If a mesa is etched as described above, the second diamond material layer can be deposited so that there is direct contact between the first diamond material layer and the second diamond material layer for reduced thermal impedance from the device channel region to the first diamond material layer second surface/heat sink.

An alternate approach of implementing a first diamond material layer on the backside of the III-nitride semiconductor material is to etch a trench through the silicon or silicon carbide substrate to the second side of the III/nitride material, optionally remove the AlN nucleation layer and the one or more III-nitride strain relief layers, and grow a First Diamond material layer on the III-nitride material second surface using the nucleation and CVD diamond approaches described for the full silicon, silicon carbide, or sapphire substrate removal process/device. A diamond composite layer can be implemented in the same manner as for the full silicon, silicon carbide, or sapphire substrate removal process/device In other embodiments, a Second Diamond material layer can be grown on the III-nitride material (with optional protection layer) either before gate fabrication or after gate fabrication. Mesas can be etched through the III-nitride material such that the Second Diamond material layer makes direct contact to the First Diamond material layer that is grown in the trench.

ADVANTAGES AND NEW FEATURES

Integrating one or more diamond layers into a semiconductor device in accordance with the present invention provides several advantageous features, including:

low thermal impedance between the diamond heat spreader and the semiconductor material;
diamond on second side of semiconductor material;
diamond on perpendicular sides of semiconductor material for additional reduction of thermal resistance;
diamond integrated on first side of semiconductor material for additional reduction of thermal resistance;
diamond integrated on first side of semiconductor material in direct contact with diamond on second side of semiconductor material for the encased arrangement; and
diamond in a backside trench of the semiconductor device.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A material structure, comprising:
a semiconductor material structure comprising at least one semiconductor material layer, the semiconductor material structure including:
a top surface operatively associated with providing external electrical contacts for the semiconductor material structure,
a bottom surface,
a first side surface extending along a longitudinal length of the semiconductor material layer, and
a second side surface extending along the longitudinal length of the semiconductor material layer; and
a first diamond material layer substrate disposed on the bottom surface of the semiconductor material structure and operatively associated with providing thermal conduction of heat from the semiconductor material structure to an associated heat sink, wherein the first diamond material layer substrate comprises a plurality of channels etched into the first diamond material layer substrate to form pathways for air or liquid,
the first diamond material layer substrate extending along at least one of the first side surface extending along the longitudinal length of the semiconductor material layer and the second side surface extending along the longitudinal length of the semiconductor material layer so that at least one semiconductor material layer in the semiconductor material structure is at least partially embedded in the first diamond material layer substrate on at least two perpendicular sides,
wherein a lateral length of the semiconductor material structure is configured based on a mismatch between a first coefficient of thermal expansion of the semiconductor material structure and a second coefficient of thermal expansion of the first diamond material layer substrate, such that the lateral length of the semiconductor material structure reduces a compressive lateral strain along the lateral length of the semiconductor material structure at a junction of the first diamond material layer substrate and the bottom surface of the semiconductor material structure, and
wherein the lateral length is further configured such that ohmic contacts of a source and a drain of a semiconductor device formed on a top surface of the semiconductor material structure overlap onto the semiconductor material structure and side surfaces of the first diamond material layer substrate.

2. The material structure according to claim 1, further comprising a second diamond material layer disposed on a top surface of the semiconductor material structure.

3. The material structure according to claim 2, wherein one of the first and second diamond material layers extends along the first and second side surfaces of the semiconductor material structure so that at least a portion of a semiconductor material layer is encased within the first and second diamond material layers.

4. The material structure according to claim 1, wherein the first diamond material layer substrate is a diamond composite layer comprising a diamond layer contacting the semiconductor material structure on a first side of the diamond material layer and further comprising a second material deposited on a second side of the diamond material layer opposite the first side.

5. The material structure according to claim 1, further comprising a diamond nucleation layer disposed between the semiconductor material structure and the first diamond material layer substrate.

6. An electrical device, comprising:
a semiconductor material structure comprising a plurality of semiconductor material layers including at least one group III-nitride semiconductor material layer;
a first diamond material layer substrate disposed on a bottom surface and side surfaces extending along a longitudinal length of the semiconductor material structure such that the semiconductor material structure is embedded in the first diamond material layer substrate on its bottom and side surfaces, wherein the first diamond material layer substrate comprises a plurality of channels etched into the first diamond material layer substrate to form pathways for air or liquid,
wherein a lateral length of the semiconductor material structure is configured to reduce a compressive lateral strain along the lateral length of the semiconductor material structure at a junction of the first diamond material layer substrate and the bottom surface of the semiconductor material structure,
the compressive lateral strain resulting from a mismatch of a thermal expansion property of the semiconductor material structure and the first diamond material layer substrate; and
a semiconductor device formed on a top surface of the semiconductor material structure,
wherein the first diamond material layer substrate is operatively associated with providing thermal conduction of heat from the semiconductor material structure to an associated heat sink.

7. The electrical device according to claim 6, wherein the group III-nitride semiconductor material layer comprises a GaN material layer; and
wherein the GaN material layer is embedded in the first diamond material layer substrate.

8. The electrical device according to claim 6, wherein electrical device further comprises a second diamond material layer disposed on the top surface of the semiconductor material structure, the first and second diamond material layers being configured so that at least a portion of the III-nitride material layer is encased within the first and second diamond material layers.

9. The electrical device according to claim 8, wherein the second diamond material layer is configured so that at least a portion of the semiconductor device on the top surface of the semiconductor material structure is encased within the first and second diamond material layers.

10. The electrical device according to claim 8, wherein the semiconductor device comprises a source, a gate, and a drain formed on the top surface of the semiconductor material structure, the source and the drain contacting the semiconductor material structure by means of corresponding ohmic contacts connected thereto.

11. The electrical device according to claim 6, wherein the semiconductor device comprises a source, a gate, and a drain formed on the top surface of the semiconductor material structure, the source and the drain contacting the semiconductor material structure by means of corresponding ohmic contacts connected thereto.

12. The electrical device according to claim 11, wherein the lateral length of the semiconductor material structure is configured so that a portion of at least one of the ohmic contacts is in direct contact with the first diamond material layer substrate.

13. The electrical device according to claim 6, wherein the lateral length of the semiconductor material structure is configured so that the ohmic contacts of the semiconductor device are situated entirely on the semiconductor material structure.

14. An electrical device, comprising:
a semiconductor material structure comprising:
a semiconductor material layer;
a first diamond material layer substrate disposed on a bottom surface and side surfaces extending along a longitudinal length of the semiconductor material structure such that the semiconductor material structure is embedded in the first diamond material layer substrate on its bottom and side surfaces, wherein the first diamond material layer substrate comprises a plurality of channels etched into the first diamond material layer substrate to form pathways for air or liquid,
wherein a lateral length of the semiconductor material structure is configured to minimize a compressive lateral strain along the lateral length of the semiconductor material structure, and wherein the lateral strain results from a mismatch of a thermal expansion property of the semiconductor material structure and the first diamond material layer substrate; and
a semiconductor device formed on a top surface of the semiconductor material structure.

15. The electrical device of claim 14, further comprising:
a gate electrode configured to reside outside lateral dimensions of the semiconductor material structure and to overlap onto a first side surface of the side surfaces of the first diamond material layer.

16. The electrical device of claim 14, wherein the lateral length is configured such that ohmic contacts of the semiconductor device overlap onto the semiconductor material structure and the side surfaces of the first diamond material layer.

17. The electrical device of claim 14, further comprising:
a III-nitride material layer deposited on the diamond nucleation layer; and
an interface material layer deposited on the III-nitride material layer, wherein a material composition of the interface material layer is selected such that a first coefficient of thermal expansion of the interface material layer is approximately equal to a second coefficient of thermal expansion of the III-nitride material layer and a third coefficient of thermal expansion of a handle substrate configured to be coupled to the III-nitride material layer.

18. The electrical device of claim 17, further comprising:
a passivating layer deposited on the III-nitride layer.

19. The electrical device of claim 14, wherein the semiconductor material structure further comprises:
- a plurality of strain relief layers, configured to reduce compressive lateral strain along the lateral length of the semiconductor material structure, implemented as stacked epitaxial layers; and
- a diamond nucleation layer disposed between the semiconductor material structure and a first diamond material layer substrate, wherein the strain relief layers are formed between the semiconductor material layer and the diamond nucleation layer.

20. The electrical device of claim 14, further comprising:
- an insulator material layer coupled to the first diamond material layer substrate; and
- a heat sink coupled to the insulator material layer.

\* \* \* \* \*